United States Patent
Walczyk et al.

(10) Patent No.: US 11,592,472 B2
(45) Date of Patent: Feb. 28, 2023

(54) THERMAL SWITCH FOR RAPID THERMAL COUPLING AND DECOUPLING OF DEVICES UNDER TEST

(71) Applicant: INTEL CORPORATION, Santa Clara, CA (US)

(72) Inventors: Joe F. Walczyk, Tigard, OR (US); James Hastings, Chandler, AZ (US); Morten Jensen, Mesa, AZ (US); Todd Coons, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 690 days.

(21) Appl. No.: 16/417,408

(22) Filed: May 20, 2019

(65) Prior Publication Data

US 2020/0371155 A1 Nov. 26, 2020

(51) Int. Cl.
*G01R 31/28* (2006.01)
(52) U.S. Cl.
CPC ..... *G01R 31/2863* (2013.01); *G01R 31/2875* (2013.01); *G01R 31/2877* (2013.01)
(58) Field of Classification Search
CPC ............ G01R 31/2863; G01R 31/2875; G01R 31/2877; G01R 31/2896; G01R 1/07307; G01R 31/2874; G01R 31/003; G01R 31/2862; G01R 1/0466; G01R 31/002; G01R 31/2808; G01R 31/2886; G01R 31/2889; G01R 33/31; G01R 33/305; H01L 21/4882; H01L 23/473; H01L 2225/06589; H01L 21/324; G01K 1/16; G01K 7/021; G01K 7/425

See application file for complete search history.

(56) References Cited

U.S. PATENT DOCUMENTS

| | | | | |
|---|---|---|---|---|
| 6,219,243 | B1* | 4/2001 | Ma | H01L 23/36 257/E23.101 |
| 6,751,099 | B2* | 6/2004 | Vrtis | H01L 23/3737 524/270 |
| 9,222,708 | B2* | 12/2015 | Tomimatsu | F25B 21/00 |
| 9,791,501 | B2* | 10/2017 | Diglio | G01R 31/2875 |
| 2021/0199712 | A1* | 7/2021 | Ohmart | G01R 31/2891 |
| 2022/0187361 | A1* | 6/2022 | Kabbani | G01R 31/2863 |

* cited by examiner

*Primary Examiner* — Vinh P Nguyen
(74) *Attorney, Agent, or Firm* — Essential Patents Group, LLP.

(57) ABSTRACT

An apparatus for testing integrated circuits (ICs), includes a first thermal contact structure having a first surface to interface with a heat source and an opposing second surface to interface with a device under test (DUT). A second thermal contact structure is above the first thermal contact structure and separated therefrom by a variable-resistance thermal interface (VRTI) structure operable to couple or decouple the first and second thermal contact structures from one another. The VRTI structure has a maximal thermal conductivity associated with a first state, and a minimal thermal conductivity associated with a second state.

20 Claims, 11 Drawing Sheets

THERMAL SWITCH FOR RAPID THERMAL COUPLING AND DECOUPLING OF DEVICES UNDER TEST

BACKGROUND

Thermal control during testing of integrated circuit (IC) devices is a requirement set by reliability standards for device performance in a defined temperature range. The test apparatus must be able to heat and cool the device under test (DUT) rapidly to maintain a desired silicon junction temperature setpoint. The ability to maintain a desired setpoint temperature is primarily governed by the thermal capacitance and resistances of the thermal masses in contact with the DUT. Fast-acting dynamic control may be difficult if the thermal masses in contact with the DUT have a high heat thermal impedance. Rapid heating and cooling of the DUT may help to enable higher testing throughput by reducing device test temperature cycling times.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
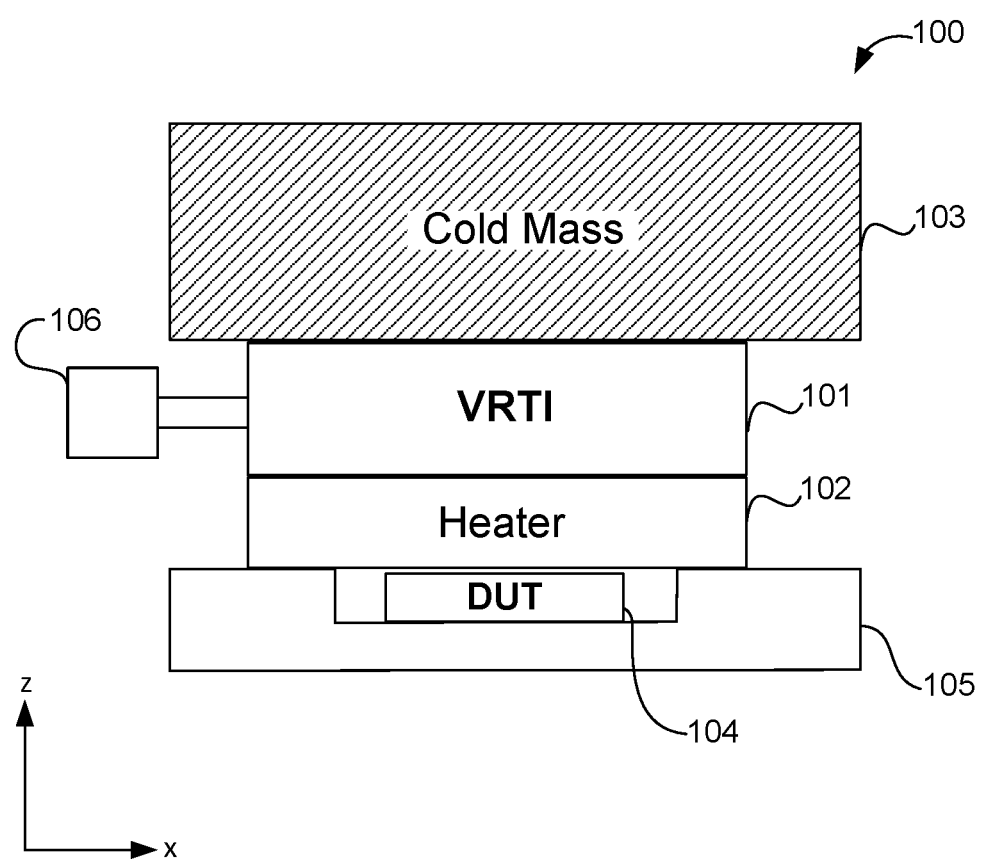
FIG. 1 illustrates a profile view in the x-z plane of a device test head comprising a Variable Resistance Thermal Interface (VRTI), according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "high-k" generally refers to materials having high thermal conductivity, where k is the coefficient of thermal conductivity, as understood by persons skilled in the art. "High-k" is used throughout this disclosure to refer to materials having thermal conductivities of at least 10 W/mK (mks units: W refers to thermal energy transfer rate in watts, m refers to meters, and K refers to degrees Kelvin).

Here, the term "DUT" generally refers to a "device under test". A DUT may be an integrated circuit including microprocessors, other digital integrated circuits and analog integrated circuits.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

A variable-resistance thermal interface (VTRI) is disclosed. The VRTI may be placed between a heat source and a heat sink, and may be employed to provide rapid thermal response temperature cycling, heating or cooling of a device under test (DUT), or a thermal process (e.g., curing, annealing, etc.). In some embodiments, the VRTI is directly coupled to a heat source. The VRTI may function as a heat throttle comprising a variable thermal resistance that may be regulated between fully insulating and fully conducting states. Some embodiments disclosed herein employ exemplary methods to modulate the thermal resistance between the heat source and heat sink. In some embodiments, the heat source is an active heater. The heat sink may be a passive finned heat sink, an active finned heat sink with a circulating heat transfer fluid, a cold finger or cold plate coupled to a cold liquid source (e.g., a liquid nitrogen source), or a thermoelectric cooler.

In some embodiments, the VRTI comprises a deformable thermal interface material (DTIM) within a chamber. In some embodiments, the deformable thermal interface comprises a liquid or powder heat transfer material contained within a deformable sac. In some embodiments, the DTIM comprises an elastic heat transfer material, such as a high-k silicone. During operation of the VTRI, the DTIM is within a gap between a hot mass and a cold mass. In the conducting state, the DTIM brides the gap and thermally couples the hot mass to the cold mass. The gas may compresses the DTIM, lifting it off of the surface of either the hot mass or the cold mass. To return to the conducting state, the gas is withdrawn from the gap, permitting the DTIM to expand and bridge the gap. A gas, such as air, or a noble gas such as argon or xenon, may be employed. The noble gases have a large mass and low intrinsic thermal conductivity k, where k is the thermal conductivity in W/mK (see definitions of units above).

In some embodiments, the VTRI comprises a variable-pressure heat pipe. A heat pipe comprises a piston within a cylinder to increase or reduce background pressure of an inert gas (e.g., air) within the heat pipe. A working fluid is passively circulated within the heat pipe in both vapor and liquid form, where the working fluid vaporizes at a hot interface and condenses at a cold interface. The vapor pressure of the working fluid and hence its boiling point may be controlled by adjusting the background pressure within the heat pipe. The VTRI may be in the conducting state when the boiling point of the working fluid is lower than the temperature of the hot surface. The vaporized working fluid condenses at the cold interface, transferring heat from the hot surface to the cold surface. By increasing the background pressure of the inert gas within the heat pipe, the boiling point of the working fluid may be raised above the temperature of hot interface, placing the VTRI in the insulating state. Increasing the background pressure within the heat pipe may be achieved by compression of the inert gas and working fluid by moving the piston in one or more compression strokes. Decreasing the background pressure may be achieved depressurizing the heat pipe.

Thermal resistance of the VTRI may be controlled by adjusting the background pressure within the heat pipe. By raising and lowering the background pressure, the boiling point of the working fluid may be raised and lowered, imparting a variable thermal resistance to the VTRI. Most rapid cooling may be achieved by adjusting the boiling point of the working fluid to be at or below the temperature of the hot surface. As the hot surface cools, the background pressure may be lowered further to drive the boiling point of the working fluid to a temperature below the hot surface temperature. The hot surface may be cooled to a temperature that corresponds to the vapor pressure of the working fluid (in the liquid state) at a specific temperature.

To achieve a temperature that is equal to the temperature of the hot surface, the background pressure of the heat pipe may be varied so that the boiling point of the working fluid is at the setpoint temperature. The lowest setpoint temperature achievable thus depends on the choice of working fluid, and may correspond to the volatility of the working fluid, where its vapor pressure at a reference temperature, such as its vapor pressure at 25° C., is a reference point. To render the VTRI in an insulating state, the temperature of vaporization of the working fluid may be adjusted by increasing the background pressure of the heat pipe so that the boiling point of the working fluid is above the temperature of the hot mass. This may be above atmospheric pressure (e.g., at sea level), increasing the boiling point of the working fluid above the sea level boiling point. The composition of the working fluid may also be adjusted to achieve a desired volatility.

In some embodiments, the VRTI comprises multiple bridge fins within a gap between a hot mass and a cold mass. In some embodiments, the bridge fins are distributed along a movable rod that is shuttled or rotated to mechanically engage and disengage the bridge fins with fixed extension fins protruding from both the hot mass and the cold mass into the gap. When the bridge fins are brought into contact with the fixed extension fins and engaged therewith, the VRTI is in a conducting state and heat is transferred from the hot mass to the cold mass by thermal conduction through the movable bridge fins. The VRTI is in the insulating state when the bridge fins are disengaged from the fixed extension fins and the hot mass is decoupled thermally from the cold mass.

In some embodiments, the bridge fins may be linearly distributed on a rod that is linearly translatable to shuttle the bridge fins into contact and out of contact with the hot mass and the cold mass. In some embodiments, the rod is rotated to bring the bridge fins into contact with fixed fins or slots on the hot and cold masses to place the VRTI in a conducting state.

In some embodiments, the VRTI comprises a chamber between the hot mass and the cold mass. Particles comprising a high-k material are introduced into the chamber and fills it, coupling the hot mass to the cold mass. The high-k particles may be withdrawn from the chamber to place the VRTI in an insulating state. The high-k particles may comprise metallic particles or dielectric particles having a high thermal conductivity (e.g., k>10 W/mK). In some embodiments, a pneumatic system blows the high-k particles into the chamber, and fully or partially vacuums the high-k particles out of the chamber. In some embodiments, a magnetic fields may be employed to attract paramagnetic particles into the chamber, and alternately remove them.

In some embodiments, the VRTI comprises one or more rotatable cylinders comprising a layered orthotropic metamaterial that has an anisotropic thermal conductivity. The orthotropic metamaterial presents a high thermal conductivity (e.g., high k) in a first direction through the cross-section of the cylinder. The orthotropic metamaterial has a high thermal resistance (e.g., low k) in a second direction through the cross-section of the cylinder that is orthogonal to the first direction.

The cylinder(s) may be oriented such that the high thermal conductivity direction is aligned with the direction of heat flow between the hot mass and the cold mass. The VRTI is placed in a conducting state, permitting heat flow by conduction to occur from the hot mass to the cold mass. As an example, rotation of the cylinder(s) by 90° orients the high thermal conductivity direction orthogonally to the direction of heat flow, presenting a high thermal resistance between the hot mass and the cold mass and placing the VRTI in an insulating state. Rotation of the cylinder(s).

In some embodiments, the one or more rotatable anisotropic cylinders are housed within an interface block that spans the gap between the hot mass and the cold mass. In some embodiments, the anisotropic cylinders comprise more than 70% of the volume of the interface block. Rotation of the anisotropic cylinders between zero and 90° presents a continuously variable thermal resistance between the hot mass and the cold mass. The VRTI may be gradually adjusted between a maximally conducting state and a minimally conducting (insulating) state, which depends on the orientation angle.

In some embodiments, the one or more anisotropic cylinders comprise alternating layers of a high-k material and a low-k material (e.g., metal layers alternating with low-k dielectric layers). In alternative embodiments, the one or more anisotropic cylinders comprise a single layer of a high-k material sandwiched between two layers of a low-k material. The layers extend longitudinally along the axes of the one or more cylinders.

The VRTI permits near-instantaneous thermal coupling and decoupling of hot and cold masses without displacement of the thermal masses, avoiding wear and damage caused by repeated contact. In device testing implementations, rapid cooling of a DUT may be enabled by VRTI-mediated thermal coupling of a heater block (for heating the DUT) to a cold mass. Reciprocally, rapid heating of the DUT to a desired temperature may be enabled by VRTI-mediated thermal isolation of the heater block from a cold mass. As an example, the heater may be physically small to facilitate rapid VRTI-mediated cooling. Rapid thermal coupling and decoupling of the heater to or from a cold mass may result in mitigation of heating and cooling latency that are generally involved with large thermal masses contacting the DUT.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates a schematic view in the x-z plane of device test head system 100 comprising VRTI 101, according to some embodiments of the disclosure.

Device test head system 100 comprises VRTI 101 between heater 102 and cold mass 103. Various embodiments of VRTI 101 are described below. As described above, VRTI 101 may perform as a thermal valve to meter heat flow between heater 102 and cold mass 103. VRTI 101 opens a path of low thermal resistance between heater 102 and cold mass 103 when in a fully conducting state. VRTI 101 may be switched or gradually changed to an insulating state, closing the path of low thermal resistance and isolating heater 102 from cold mass 103. In some embodiments, VRTI 101 may have a binary (e.g., two-state) thermal resistance, comprising a maximally conducting state and a maximally insulating state, acting as a thermal switch. In some embodiments, VRTI 101 may have a variable thermal resistance between the maximally conducting state and a maximally insulating state, enabling variable control of the rate of heat transfer.

In some embodiments, DUT 104 is an integrated circuit (IC), such as, but not limited to, a microprocessor, another digital IC such as a memory, or an analog IC. In the illustrated embodiment, DUT 104 is shown enclosed within oven 105 for maintaining a controlled temperature environment for DUT 104 during testing, so the DUT is held at a controlled temperature. In alternative embodiments, DUT 104 may be held on a less confined testing platform. In the illustrated embodiment, heater 102 may be a heating block comprising one or more heating elements. VRTI 101 may be in direct contact with heater 102, as shown in FIG. 1. Alternatively, a layer of a high-k thermal interface material, such as a thermal grease, gel or pad, may intervene between VRTI 101 and heater 102 for eliminating air gaps and increasing heat transfer.

Heater 102 may be a small thermal mass in comparison to cold mass 103. Physical dimensions of heater 102 may be similar to the physical dimensions of DUT 104. DUT 104 may have a small thermal mass. By regulating the thermal resistance of the predominant heat flow path to cold mass 103, VRTI 101 may enable heater 102 to be rapidly heated and cooled (e.g., by switching VRTI to a conducting state), enabling rapid heating and cooling of DUT 104.

VRTI 101 may be in direct contact with cold mass 103. A TIM layer may intervene between VRTI 101 and cold mass 103 for lowering thermal resistance at the interface between VRTI 101 and cold mass 103. In some embodiments, cold mass 103 is a passive finned heat sink block. In some embodiments, cold mass 103 is an active heat sink block comprising fluid circulation tubing to cool the block below room temperature. A fluid may be a coolant such as water or aqueous solutions of ethylene glycol. In some embodiments, cold mass 103 comprises a cold plate in contact with a liquid nitrogen reservoir.

The cold plate may be in the lower portion of cold mass 103 at the interface with VRTI 101, and may cooled to cryogenic temperatures well below 0° C. Cryogenic interfacial temperatures (e.g., at the interface between cold mass 103 and VRTI 101) may drive unidirectional heat transfer from VRTI 101 to cold mass 103 at high rates by developing large temperature gradients. During operation of test head 100, heater 102 and DUT 104 may be rapidly cooled due to large heat transfer rates from heater 102 to cold mass 103 may be obtained by switching VRTI 101 to a conducting state. In some embodiments of VRTI 101, the effective k or thermal resistance through VRTI 101 may be varied to enable intermediate rates of heat transfer, and thus cooling of heater 102 and DUT 104. In some embodiments, VRTI 101 comprises actuator 106 that may be engaged to change the thermal state of VRTI 101.

While FIG. 1 illustrates a testing apparatus comprising DUT test head 100 for measuring the performance of a DUT at controlled temperatures, the illustrated embodiment may be employed in a manufacturing process. VRTI 101 may be engaged in a manner similar to that shown in FIG. 1 to enable rapid cooling or thermal isolation of a process oven, as an example.

Figure 2A:
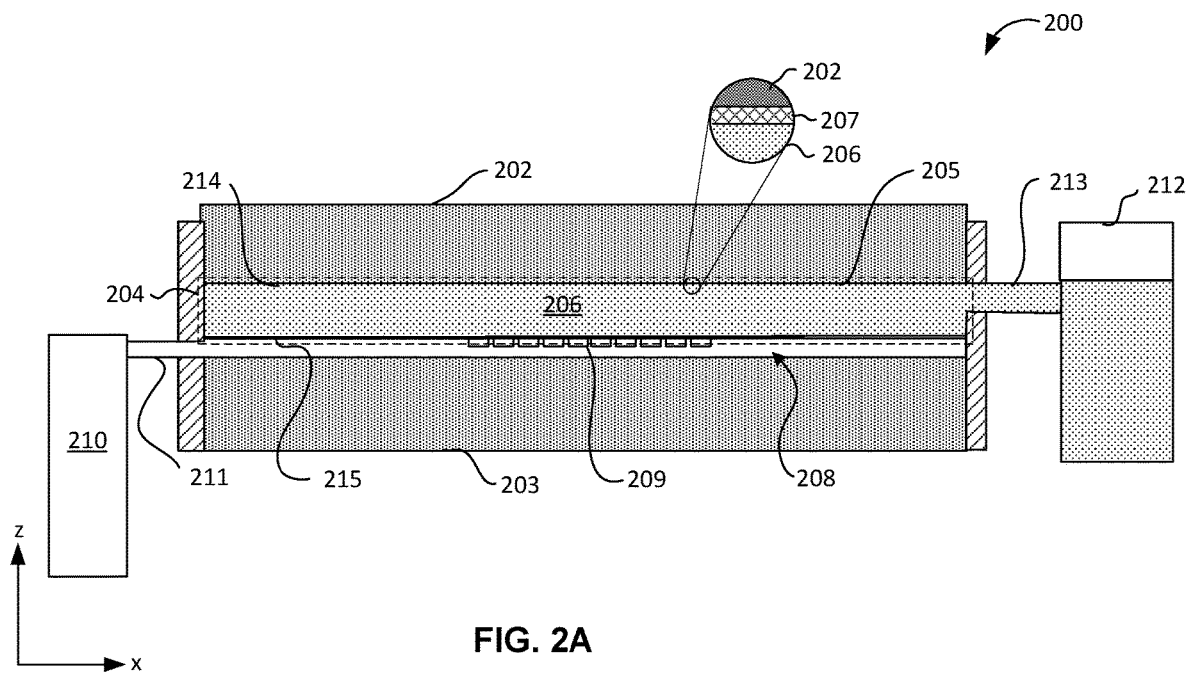
FIG. 2A illustrates a cross-sectional view in the x-z plane of a VRTI comprising a deformable thermal interface, according to some embodiments of the disclosure.

FIG. 2A illustrates a cross-sectional view in the x-z plane of VRTI 200 in a conducting state, comprising deformable thermal interface material (DTIM) 206, according to some embodiments of the disclosure.

VRTI 200 comprises upper contact plate 202 and lower contact plate 203 above and below, respectively, chamber 204. In some embodiments, chamber 204 is a hermetically sealed air-tight cavity. Deformable thermal interface 205 extends along the length (in the x-direction) of chamber 204, delineated by the dashed enclosure. In some embodiments, deformable thermal interface 205 comprises deformable thermal interface material (DTIM) 206 contained within sac 207, shown in the enlarged view of the inset.

As shown in the illustrated embodiments, below chamber 204 is conduit 208 that extend through lower contact plate 203 and communicates with (e.g., opens into) chamber 204 through nozzle array 209. In some embodiments, nozzle array 209 is a grill covering conduit 208, wherein the grill comprises a plurality of orifices. In some embodiments, conduit 208 is integral with lower contact plate 203. Nozzle array 209 may be a plate having an array of orifices, and fastened or welded to lower contact plate 203. It will be understood that the configuration shown in the illustrated embodiment is not limiting, and that in alternate embodiments, conduit 208 and nozzle array 209 may be part of upper contact plate 202.

Conduit 208 is coupled to a pressurized gas reservoir 210 through tubing 211. Tubing 211 may be coupled to conduit 208 by any number of suitable methods. During operation of VRTI 200, binary switching between high effective conductivity and low effective conductivity states is performed by introduction or withdrawal of pressurized gas into chamber 204, respectively. Forcing pressurized gas into chamber 204 compresses deformable TIM 205 and may force DTIM 206 out of the interior of sac into a reservoir (e.g., TIM reservoir 212 described below).

DTIM 206 may comprise a liquid metal, such as, but not limited to, gallium and eutectics of gallium comprising any of indium, tin and zinc. Melting (liquidus) points of gallium eutectics may be below approximately 30° C. Gallium alloys may have thermal conductivities ranging between approximately 15 and 30 W/mK. In alternative embodiments, DTIM 206 comprises a thermal grease, gel or paste comprising an organic matrix comprising polymers such as, but not limited to, any of epoxies, silicones, urethanes and acrylates. Within the organic matrix is generally a high-k filler material as particulates, such as, but not limited to, any of boron nitride, aluminum nitride, aluminum oxide and zinc oxide, silver and copper. Thermal conductivities of thermal greases, gels or pastes may range between approximately 1 to 10 W/mK.

Sac 207 may comprise an organic plastic film or a metal foil. Organic polymers such as, but not limited to, any of polypropylene, polyethylene, polyethylene terephthalates (PET). Metal foils may comprise materials such as, but not limited to, aluminum, copper, molybdenum, tungsten, titanium or stainless steel. In some embodiments, sac 207 has walls that range in thickness between 10 and 50 microns, where the range of thickness is limited by tear and shear strength and ductility considerations. In some embodiments, sac 207 is sealed by welded seams. In some embodiments, sac 207 has a filling orifice (not shown) to introduce DTIM 206 into the interior.

In some embodiments, sac 207 may be fastened to upper contact plate interior surface 214 by any number of suitable methods. In some embodiments, sac 207 may be welded to upper contact plate interior surface 214. In some embodiments, bolts or screws (not shown) fasten sac 207 to upper contact plate interior surface 214. In some embodiments, sac 207 is fastened to upper contact plate interior surface 214 by an adhesive. In alternate embodiments, sac 207 is fastened to lower contact plate interior surface 215 by similar methods.

In some embodiments, connector 213 is extends from sac 207 to the exterior of chamber 204, coupling deformable thermal interface 205 to TIM reservoir 212. In some embodiments, connector 213 is an extension of sac 207. In some embodiments, connector 213 is a portion of tubing integral with sac 207, and comprising a material that is different from the material comprised by sac 207. Connector 213 opens into TIM reservoir 212 for free movement of fluid TIM 206 into and out of deformable thermal interface 205. Pressurization of the head space over fluid DTIM 206 may be employed to move DTIM 206 into sac 207 and inflate deformable thermal interface 205. During this operation, deformable thermal interface 205 may at least partially fill chamber 204 such that deformable thermal interface 205 to extend vertically (in the z-direction of the figure) between upper contact plate 202 and lower contact plate 203. Deformable thermal interface 205 may swell to contact lower contact plate interior surface 215, which comprises the floor of chamber 204.

While deformable thermal interface 205 remains inflated (by filling sac 207 with TIM 206), the gap between upper and lower contact plates 202 and 203, respectively is bridged, sac 207 may substantially cover lower contact plate interior surface 215, creating a path of low thermal resistance between lower and upper contact plates 202 and 203, respectively. In this condition, VRTI 200 is in a conductive state (e.g., a state of high effective thermal conductivity).

Figure 2B:
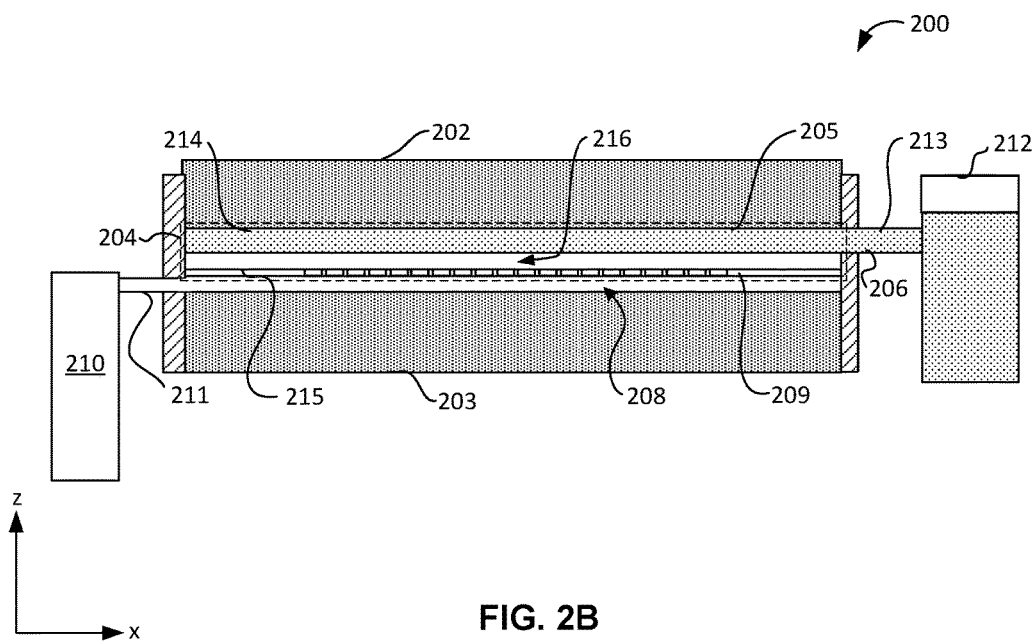
FIG. 2B illustrates a cross-sectional view in the x-z plane a VRTI in an insulating state, according to some embodiments of the disclosure.

FIG. 2B illustrates a cross-sectional view in the x-z plane of VRTI 200 in an insulating state, according to some embodiments of the disclosure.

Reversal of the process may be performed to place VRTI 200 in an insulating state (e.g., a state of high thermal resistance). Deformable thermal interface 205 is shown in FIG. 2B compressed by pressurization of chamber 2014, where DTIM 206 is forced back into TIM reservoir 212. Deformable thermal interface 205 is shown in a deflated state.

By compression of deformable thermal interface 205, contact between deformable thermal interface 205 and lower contact plate 203 is disrupted by formation of gap 216 within chamber 204. VRTI 200 is abruptly switched to a thermally insulating state. A suitable pressurized gas may be introduced into chamber 204 to compress deformable thermal interface 205 and force DTIM 206 to flow back into TIM reservoir 212. To force DTIM 206 to flow into TIM reservoir 212, the gas within chamber 204 may pressurized to a pressure substantially higher than the pressure of the head space within TIM reservoir 212. Alternatively, a pressure relief valve (not shown) coupled to TIM reservoir 212 may open, reducing the head space pressure while fluid DTIM 206 is forced back into TIM reservoir 212 by compression of deformable thermal interface 205.

Suitable gases that may be employed to compress deformable thermal interface 205 include, but are not limited to, any of air, nitrogen, helium, argon or xenon. Heavy noble gases such as argon or xenon have a lower intrinsic thermal conductivity than light atoms or molecules such as helium, oxygen and nitrogen, and may contribute to a high thermal resistance of the VRTI in the insulating state.

Figure 3A:
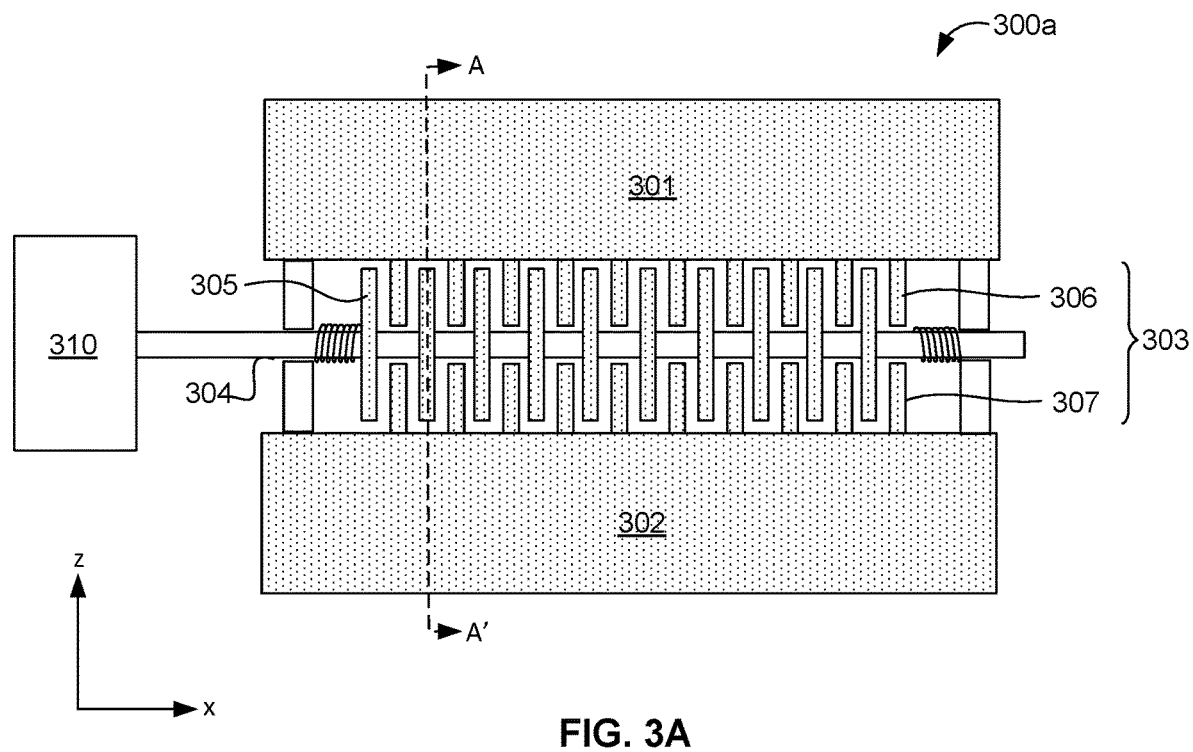
FIG. 3A illustrates a cross-sectional view of a VRTI having movable bridge fins, according to some embodiments of the disclosure.

FIG. 3A illustrates a cross-sectional view of VRTI 300a having movable bridge fins, according to some embodiments of the disclosure.

VRTI 300a comprises upper contact plate 301 and lower contact plate 302, separated by vault 303. Shaft 304 extends along the length (e.g., in the x-direction) of vault 303 and is translatable along its axis (in the x-direction). Multiple bridge fins 305 extend substantially orthogonally from shaft 304, and are distributed along shaft 304. By translating shaft 304 to the left of the figure, bridge fins 305 engage a plurality of upper stationary fins 306, extending below upper contact plate 301 into vault 303, and a plurality of lower stationary fins 307, extending above lower contact plate 302 into vault 303. In some embodiments, upper stationary fins 306 are aligned over lower stationary fins 307 and separated from each other by an air gap. When engaged, bridge fins 305 bridge the air gap between upper stationary fins 306 and lower stationary fins 307, having physical contact therebetween. A low thermal resistance path is created for heat transfer between upper contact plate 301 and lower contact plate 302. In some embodiments, upper and lower contact plates 301 and 302, including upper and lower stationary fins 306 and 307, respectively, comprise metals, such as, but not limited to, any of copper, iron (steel), nickel, cobalt, molybdenum, tungsten and titanium. Bridge fins 305 may comprise the same materials.

Shaft 304 may extend through walls 308, where retention springs 309 may be attached. Retention springs 309 may be compression springs that compress when shaft 304 is shuttled to the left or right for contact with upper and lower stationary fins 306 and 307, respectively. Shaft 304 may be coupled to actuator 310 to effectuate linear motion of shaft 204 and bridge fins 305. In some embodiments, actuator 310 is a linear motor. In some embodiments, actuator 310 is an electromagnetic drive mechanism, where linear motion is actuated by a pulling action of a stationary magnetic field on a portion of shaft 304 that comprises a ferromagnetic material. Conversely, an electromagnet may be integrated onto shaft 304, and pull against ferromagnetic portions of VRTI 300a to move shaft 304 laterally. In some embodiments, actuator 310 comprises a pneumatic or a hydraulic piston mechanism to drive shaft 304 laterally.

Any number of upper and lower stationary fins 306 and 307 may be employed. An optimal number of fins is a function of the length (in the x-dimension), the thickness of the fins (e.g., fins 305, 306 and 307), and center-to-center distance between fins in the x-direction. When bridge fins 305 are disengaged, VRTI 300a is in an insulating state. Upper and lower stationary fins 306 and 307 have dimensions (e.g., thickness in the x-direction and z-height) that may be optimized to minimize convective heat dissipation, contributing to thermal isolation of upper and lower contact plates 301 and 302, respectively. Dimensions of bridge fins 305 and stationary fins 306 and 307 may be engineered to minimize convective heat transfer and maximize conductive heat transfer.

A ratio of the convective heat transfer coefficient h over the thermal conductivity k of the fin is expressed by the Nusselt number (Nu) as Nu=hL/k, where L is the length of the surface of the fin. As an example, a thickness-to-z-height aspect ratio may be optimized to favor conduction over heat dissipation by convection into the surroundings by minimizing the Nusselt number. Minimization of the Nusselt number may be accomplished by minimization of the surface-to-volume ratio of the fins, for example by increasing the thickness of the fins with respect to the fin z-height and to the fin width (e.g., in the y-dimension). Accordingly, the z-height and width of the fins may be reduced to minimize L.

Figure 3B:
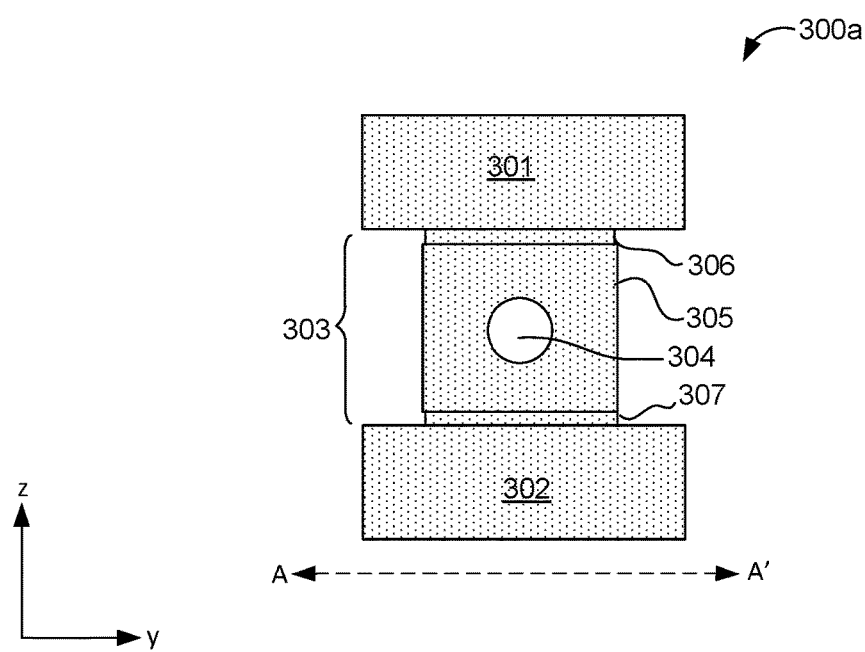
FIG. 3B illustrates a cross-sectional view in the y-z plane of a VRTI, according to some embodiments of the disclosure.

FIG. 3B illustrates a cross-sectional view in the y-z plane of VRTI 300a, according to some embodiments of the disclosure.

The end-on view of VRTI 300a in FIG. 3B, taken along section A-A' in the y-z plane of FIG. 3A, shows the lateral extent of bridge fins 305 (in they and z-directions of the figure) in relation to stationary fins 306 and 307 extending into vault 303 from upper and lower contact plates 301 and 302, respectively, which are obscured by bridge fin 305 as shown. In the illustrated example, bridge fins 305 have a square shape, with substantially equal lateral dimensions. The particular shape of bridge fins 305 and stationary fins (e.g., stationary fins 306 and 307) is not limited to the embodiment shown in FIG. 3A. Other suitable shapes, including curved shapes, are possible. Bridge fin 305 may be welded or brazed onto shaft 304 for a rigid fixture. In some embodiments, bridge fin(s) 305 and shaft 304 are formed as a single unit by casting methods. In some embodiments, bridge fins 305 are attached by one or more bolts or set screws.

In some embodiments, shaft 304 has a rectangular cross section. Bridge fins 305 are coupled to flat sides of shaft 304 by spring-loaded hinges 311 to provide a compliant coupling of bridge fins 305 to stationary fins 306 and 307.

Figure 3C:
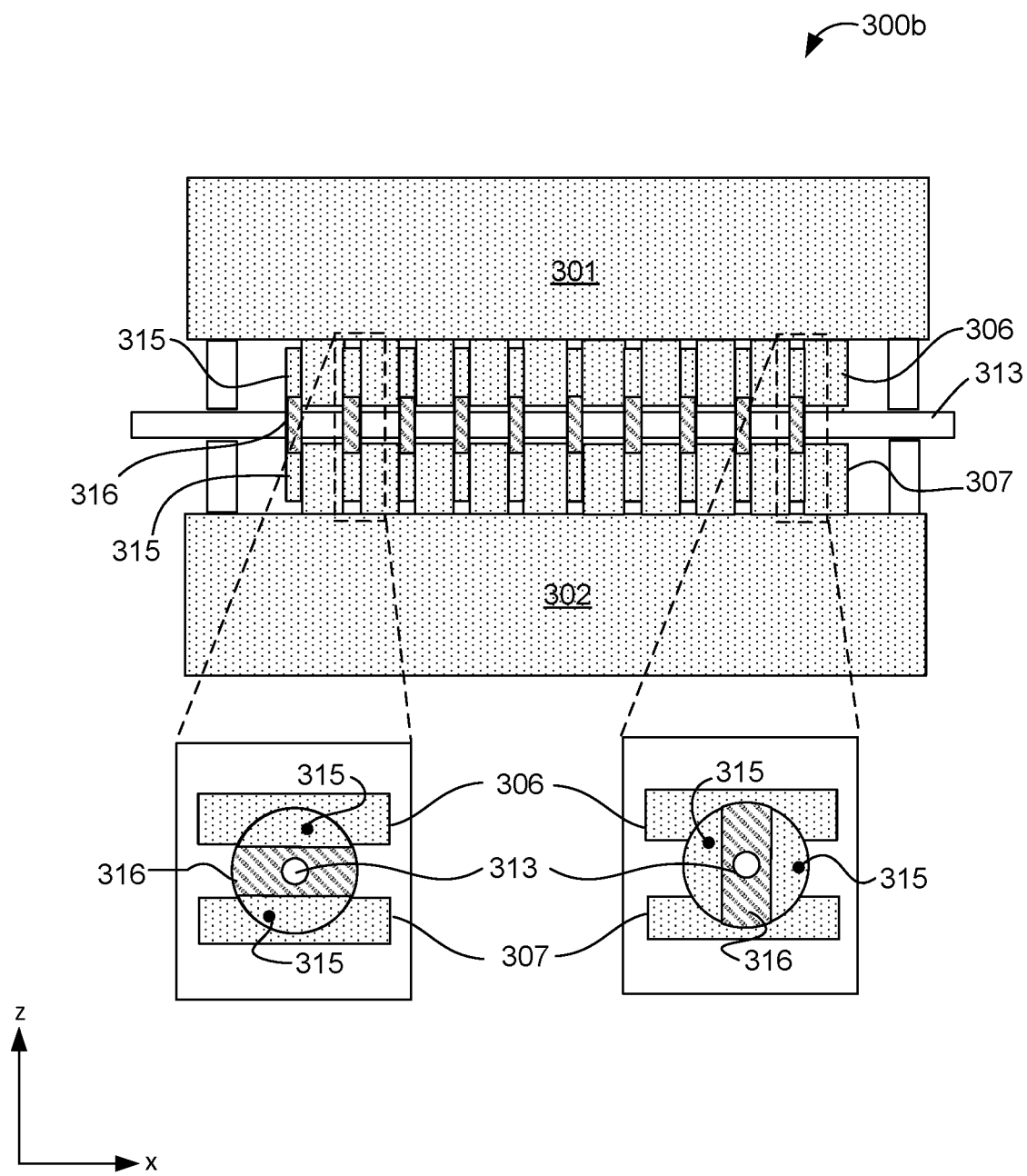
FIG. 3C illustrates a cross-sectional view in the x-z plane of a VRTI, according to some embodiments of the disclosure.

FIG. 3C illustrates a cross-sectional view in the x-z plane of VRTI 300b, according to some embodiments of the disclosure.

VRTI 300b comprises shaft 313 that is fixed in the x, y and z dimensions, but is rotatable. Bridge fins 314 comprise split high-k sections 315 that are separated by a low-k middle section 316 (shown face-on in the insets). The insets show a circular shape for bridge fins 314, however, it will be understood that bridge fins 314 may have a rectangular shape or other suitable shape. Bridge fins 314 permanently abut upper and lower stationary fins 306 and 307 and are in physical contact therewith. In the illustrated embodiment, bridge fins 314 abut upper and lower stationary fins 306 and 307 on both sides. As shown, adjacent upper stationary fins 306 and adjacent stationary fins 307 are laterally bridged by bridge fins 315.

High-k sections 315 may comprise a metal such as, but not limited to, any of copper, silver, aluminum, iron, nickel, cobalt, molybdenum and tungsten. Low-k section 316 may comprise a dielectric material such as, but not limited to any of organic epoxy resins, aluminum oxide, polyphenolic resins (e.g., bakelite), polystyrene, polyvinyl chloride, polypropylene, polyurethanes and the like.

Upper and lower stationary fins 306 and 307 are thermally isolated when bridge fins 314 are rotated so that low-k section 316 of bridge fins 314 spans across gap 317 between upper and lower stationary fins 306 and 307, as shown in the left-hand inset in FIG. 3C. High-k sections 315 adjacent to upper and lower stationary fins 306 and 307, orthogonal to the direction of heat flow between lower contact plate 302 (e.g. hot thermal mass) and upper contact plate 301 (e.g., cold thermal mass). In this configuration, VRTI 300b is in the maximum low-k (most insulating) state.

When bridge fins 314 are rotated by 90°, as shown in the right-hand inset, high-k sections 315 extend vertically (in the z-direction) between upper and lower stationary fins 306 and 307, overlapping both stationary fins simultaneously. High-k sections 315 are now parallel to the direction of heat flow between lower and upper contact plates 302 and 301, thermally coupling them. The degree of overlap as shown between high-k sections 315 and stationary fins 306 and 307 is maximal in the position shown. Consequently, upper and lower stationary fins 306 and 307 are thermally coupled to a maximal degree. In the configuration shown in the right-hand inset, placing VRTI 300b in a maximal high-k (most conducting) state.

As a consequence of abutment of upper and lower stationary fins 306 ad 307 on both sides by bridge fins 315, heat flow between each pair of upper and lower stationary fins 306 and 307 may be distributed between two adjacent bridge fins 315.

At non-orthogonal rotational angles, overlap between high-k sections 315 and upper and lower stationary fins 306 and 307 may be varied between zero to maximal. Thermal coupling between upper and lower stationary fins 306 and 307 may also vary accordingly, enabling variation of the thermal resistance of VRTI 300b between the maximal and minimal states of thermal resistance.

Figure 4A:
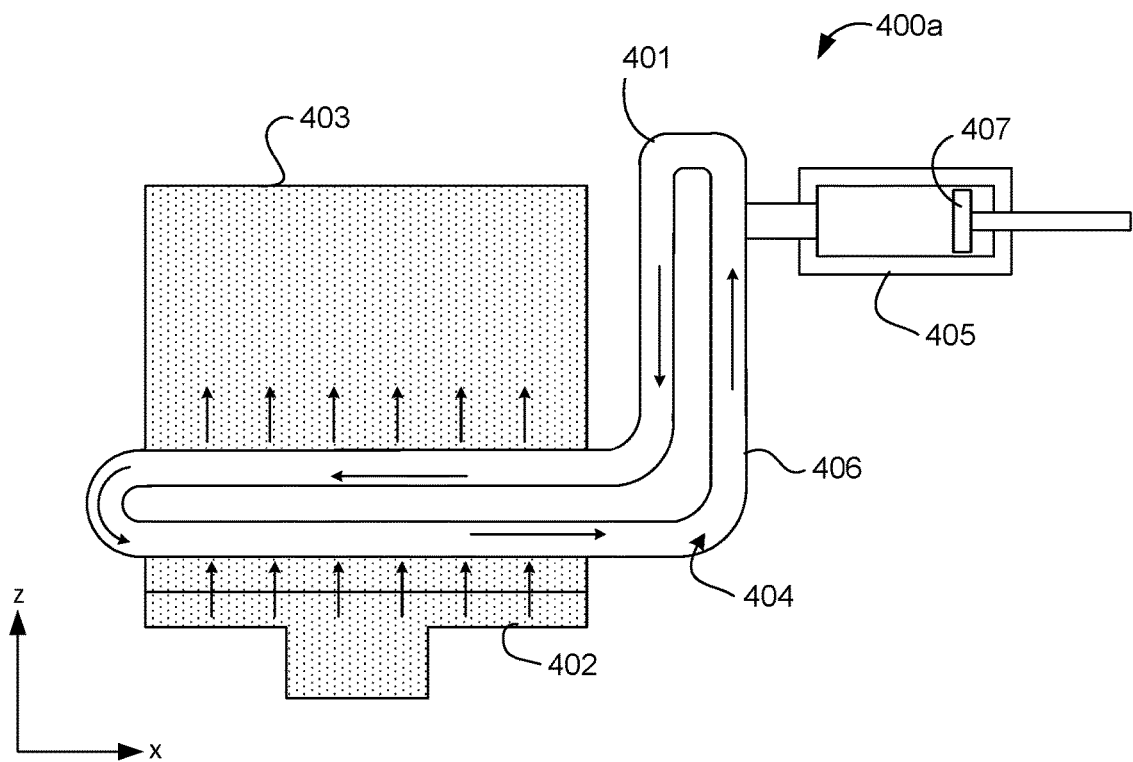
FIG. 4A illustrates a profile view in the x-z plane of a VRTI comprising a heat pipe, according to some embodiments of the disclosure.

FIG. 4A illustrates a profile view in the x-z plane of VRTI 400a, comprising heat pipe 401, according to some embodiments of the disclosure.

VRTI 400a comprises heat pipe 401 as a switchable (e.g., binary state) heat exchanger between hot mass 402 and cold mass 403. Heat pipe 401 contains a working fluid (not shown) within heat pipe interior 404. In the illustrated embodiment, piston chamber 405 extends from wall 406 of heat pipe 401. Piston chamber 405 opens into interior 404 of heat pipe 401. Piston 407 is translatable laterally (e.g., along the x-dimension) within piston chamber 405. Piston 407 may be employed to control the pressure within heat pipe interior 404. The pressure within heat pipe interior 404 may be adjusted to regulate the boiling point of the working fluid. As an example, piston 407 may be driven (e.g., to the left of the figure) to pressurize heat pipe interior 404.

When pressurized, the boiling point of the working fluid is raised to a temperature that may be above the temperature of hot mass 402. At a boiling point above the temperature of hot mass 402, VRTI 400a is switched to a state of high thermal resistance (e.g., insulating state) because the working fluid is not vaporized and remains in the liquid state, preventing heat pipe 401 from functioning.

Similarly, piston 407 may be driven in the reverse direction to decrease the pressure of heat pipe interior 404, and decreasing the boiling point of the working fluid to below the temperature of hot mass 402. VRTI 400a is then switched to state of low thermal resistance (e.g., conducting state) because the working fluid undergoes vaporization and condensation cycles, allowing heat pipe 401 to function.

The working fluid may have a boiling point that ranges from −50° C. to +100° C., and may comprise any of water, small molecular weight alcohols such as methanol, ethanol, propanol, isopropanol, butanol, isobutanol, and the like; ammonia, volatile fluorocarbons such as fluoromethanes and chlorofluoromethanes, fluoroethanes and chlorofluoroethanes (e.g., the Freon series). Other suitable working fluids are possible. In some embodiments, a make-up atmosphere within heat pipe chamber 404 comprises gases that include, but are not limited to, any of air, nitrogen, helium, argon or xenon. Argon and xenon have low intrinsic thermal conductivities, and may inhibit convective heat transfer by the make-up gas when VRTI 400a is in an insulating state. The pressure of the make-up atmosphere may be adjusted to have a minimum value that is approximately the vapor pressure of the working fluid at room temperature (e.g., 25° C.) when piston 407 is retracted to expand the volume within piston chamber 405 to a maximum value.

In some embodiments, heat pipe 401 is a single heat pipe. In some embodiments, heat pipe 401 is part of a multiple heat pipe system (shown in FIGS. 4C and 4D). In some embodiments, heat pipe 401 is a closed loop, as depicted in FIG. 4A. A portion of the loop may extend vertically (in the z-dimension) to encourage liquid to flow in one direction. As shown in FIG. 4A, arrows indicate a working fluid circulation pattern, where the working fluid is vaporized over hot mass 402 and condensed beneath cold mass 403. Condensed working fluid is encouraged to circulate in one direction (e.g., to the left of the figure) by the upward bend of heat pipe 401, and return to the hot side through the left bend of heat pipe 401. Vaporized working fluid may flow in either direction, but may preferably circulate in a counterclockwise direction due to pressure differentials set up within heat pipe interior 404, as indicated by the arrows.

Hot mass 402 may be an actively-controlled heater (e.g., heater 102 in FIG. 1). Cold mass 403 may be a heat sink, an active heat sink or a liquid nitrogen-cooled (or other cold liquid, such as refrigerated alcohols, ammonia, etc.) cold plate. Heat pipe wall 406 may comprise flat regions to interface with hot mass 402 and cold mass 403.

In the illustrated embodiment, the predominate direction of heat flow may be from hot mass 402 to cold mass 403, as indicated by the upward-pointing arrows in FIG. 4A. When pressure within heat pipe interior 404 is adjusted by piston 407 such that the boiling point of the working fluid is below the temperature of hot mass 402, VRTI 400a is in a conducting state.

While heat flows from hot mass 402 to heat pipe 401, a vaporization/condensation cycle of the working fluid is sustained (temperature of cold mass 403 is below the boiling point of the working fluid). Hot mass 402 may cool during this process. To maintain the conducting state of VRTI 400a, pressure within heat pipe interior 404 may be further reduced to follow the dropping temperature of hot mass 402, and progressively lower the boiling point of the working fluid, by continuous withdrawal of piston 407.

When it is desired to shut off heat flow from hot mass 402, piston 407 may be driven to compress the atmosphere within heat pipe interior 404, raising the boiling point of the working fluid to above the temperature of hot mass 402. An automated control system may be employed to monitor the temperature of hot mass 402, and the pressure within heat pipe interior 404.

Figure 4B:
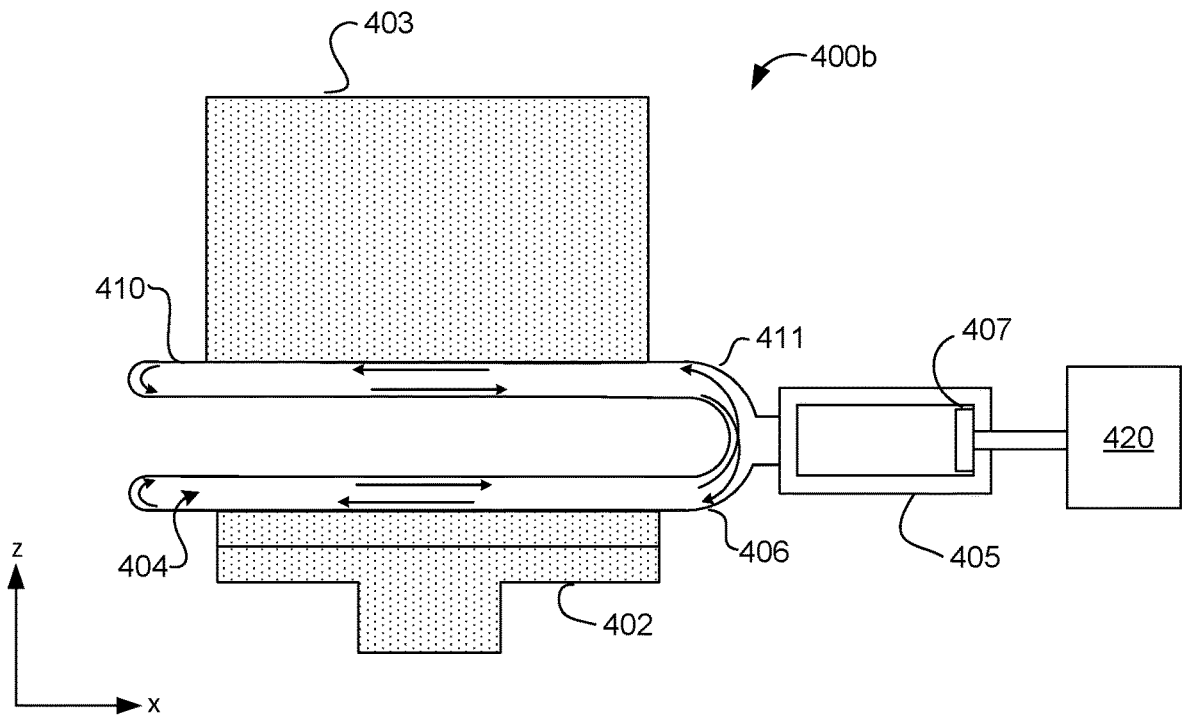
FIG. 4B illustrates a cross-sectional view in the x-z plane of a VRTI comprising a heat pipe, according to embodiments of the disclosure.

FIG. 4B illustrates a cross-sectional view in the x-z plane of VRTI 400b comprising heat pipe 410, according to embodiments of the disclosure.

VRTI 400b comprises heat pipe 410 between hot mass 402 and cold mass 403.

In contrast to heat pipe 401 in FIG. 4A, heat pipe 410 has an open loop geometry. Working fluid (not shown) may circulate in a counterclockwise manner, as condensed working fluid flows from the upper branch to the lower branch through bend 411. Vaporized working fluid may generally circulate from the lower branch to the upper branch through bend 411.

VRTI 400b may be operated in a manner similar to VRTI 400a described above. As an example, VRTI 400b may be switched between a conductive state and an insulating state. For the latter, piston 407 may compress the make-up atmosphere to a pressure exceeding the vapor pressure of the working fluid at the temperature of hot mass 402. VRTI 400b may be switched to a conducting state when the pressure within heat pipe interior 404 is reduced to a value below the vapor pressure of the working fluid at the temperature of hot mass 402.

As heat flows from hot mass 402 to cold mass 403 by sustaining the vaporization/condensation cycles within heat pipe 410, hot mas 402 may cool, dropping in bulk temperature. To maintain VRTI 400b in a conducting state, piston 407 may be retracted further within piston chamber 405 to continually reduce pressure within heat pipe interior 404. In some embodiments, piston actuator 420 may be an electric motor (e.g., a linear motor), a pneumatic or a hydraulic actuator. In some embodiments, an automated pumping system may be substituted for piston 407 and piston chamber 405.

Figure 4C:
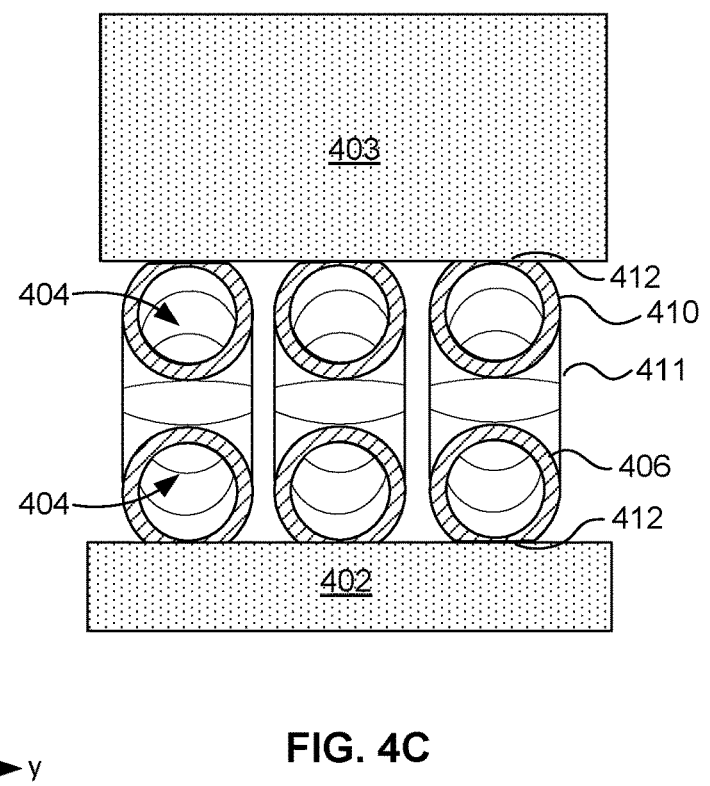
FIG. 4C illustrates a cross-sectional view of a VRTI in the y-z plane, showing multiple heat pipes having circular cross-section, according to some embodiments of the disclosure.

FIG. 4C illustrates a cross-sectional view of VRTI 400b in the y-z plane, showing multiple heat pipes 410, according to some embodiments of the disclosure.

In some embodiments, VRTI 400b comprises multiple heat pipes 410. Any suitable number of heat pipes 410 may be employed to obtain sufficient thermal conductivity to achieve a target rate of heat transfer from hot mass 402 to cold mass 403 by heat pipes 410.

The number of heat pipes 410 employed may depend on the volatility (e.g., vapor pressure) of the working fluid. A working fluid having a high volatility may be desired as its latent heat of vaporization may be low, permitting more liquid to vaporize per unit of heat input, thus higher rates of heat transfer. Multiple heat pipes 410 may be more efficient than a single large heat pipe. As an example, heat pipes having relatively small diameters have a larger surface-to-volume ratio than a single large heat pipe. Large-diameter heat pipes may require larger amounts of working fluid, due to the large size of heat pipe interiors 404, than a smaller-diameter heat pipe (e.g., heat pipe 410) to achieve the same rate of heat transfer.

A larger volume of liquid working fluid may require more heat accumulation to raise the temperature of the working fluid to the boiling point, taking more time to vaporize in comparison to a smaller volume. Consequently, the rate of heat transfer though a large-diameter heat pipe may be slow in comparison to a small-diameter heat pipe. To achieve faster rates of heat transfer and cover large surface areas, the number of multiple heat pipes having a small diameter (e.g., multiple heat pipes 410) may be scaled up as opposed to scaling up in size.

The cross-sectional view of FIG. 4C shows heat pipe wall 406 having flat portions 412 on top and bottom of heat pipes 410 for maximal contact area between heat pipes 410 and cold and hot masses 403 and 402, respectively. In some embodiments, a thermal interface material (not shown) is between flat portions 412 and hot mass 402 and cold mass 403. As mentioned above, scaling the number of multiple small (and efficient) heat pipes 410 scales the contact surface area between cold and hot masses 402 and 403, respectively, and heat pipes 410.

Figure 4D:
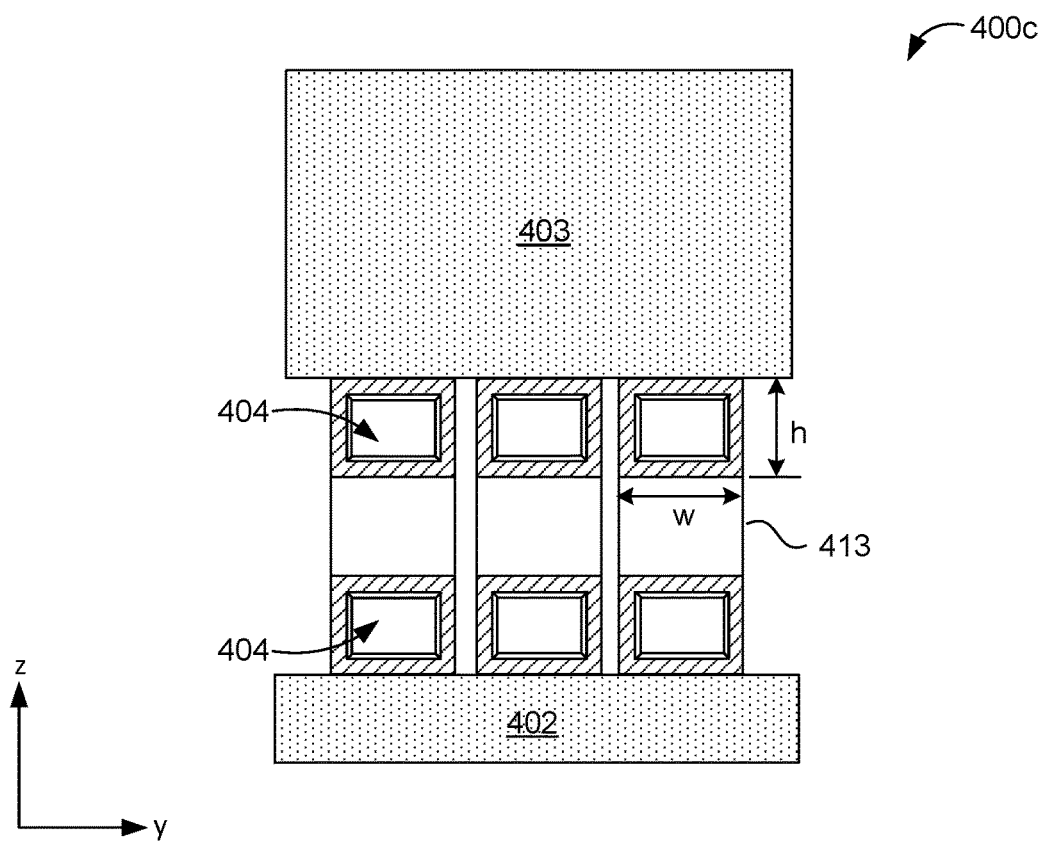
FIG. 4D illustrates a cross-sectional view in the y-z plane of a VRTI showing heat pipes having a rectangular cross section, according to some embodiments of the disclosure.

FIG. 4D illustrates a cross-sectional view in the y-z plane of VRTI 400c, showing heat pipes 413 having a rectangular cross section, according to some embodiments of the disclosure.

Heat pipes 413 having a rectangular cross section are employed in VRTI 400c as a multiple heat pipe system, as shown and described above for VRTI 400b. The rectangular cross section presents flat outer surfaces for maximizing contact between heat pipes 413 and cold and hot masses 402 and 403, respectively. The cross-sectional aspect ratio of heat pipes 413 may be adjusted for maximizing surface-to-volume ratio. As an example, the ratio of width w to z-height h (e.g., w/h) of the portions of heat pipes 413 extending in and out of the plane of the figure (e.g., in the x-dimension) may be maximized to minimize the volume of heat pipe interiors 404 and to maximize the surface-to-volume ratio of heat pipes 413.

Figure 5A:
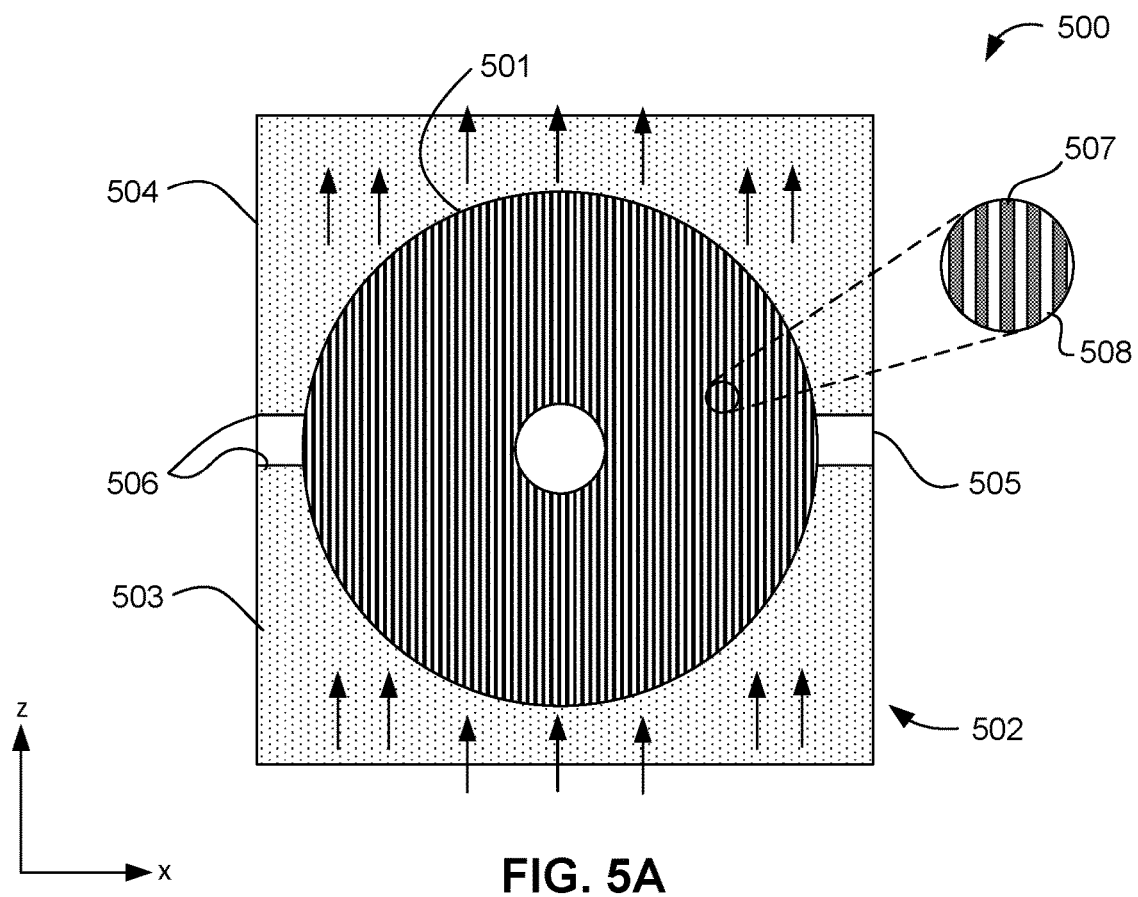
FIG. 5A illustrates a cross-sectional view in the x-z plane of a VRTI comprising a rotatable orthotropic cylinder, according to some embodiments of the disclosure.

FIG. 5A illustrates a cross-sectional view in the x-z plane of VRTI 500 comprising rotatable orthotropic cylinder 501, according to some embodiments of the disclosure.

VRTI 500 comprises orthotropic cylinder 501 within layered block 502, comprising lower portion 503 and upper portion 504, where lower portion 503 and upper portion 504 are thermally decoupled by insulating gasket 505. In some embodiments, insulating gasket comprises air, nitrogen, argon, xenon or vacuum to minimize inadvertent heat transfer between lower and upper portions 503 and 504, respectively, when VRTI 500 is in an insulating state. In some embodiments, gasket 505 has optically reflective interfaces 506 at the interfaces to further impede inadvertent heat transfer by reflecting radiated heat between lower and upper portions 503 and 504, respectively. Gasket 505 may comprise a thermally insulating material such as, but not limited to, any of epoxy resins, polyphenolic resins such as Bakelite, silica-based glasses, glass-polymer composites such as fiberglass, refractory ceramics such as clays, alumina, titania (titanium oxides), magnesium oxide, calcium oxide, gypsum or (calcium sulfate). Optically reflective interfaces 506 may comprise a highly reflective film or metal foil such as aluminum or gold-coated Mylar (e.g., polyesters), aluminum foil or gold foil.

Orthotropic cylinder 501 has an axis that extends in the y-dimension of the figure (e.g., above and below the plane of the figure), and comprises a metamaterial assembly comprising thermally conductive sheets 507 interleaved with thermally insulating sheets 508. The inset shows an enlarged view of the layered structuring of the metamaterial of the orthotropic cylinder. In some embodiments, the metamaterial comprises a periodic structure, where the thickness of the layers are repeated. As an example, the center-to-center distance between thermally conductive sheets 507 is substantially constant throughout orthotropic cylinder 501. Likewise, the center-to-center distance between thermally insulating sheets 508 is substantially constant from constant throughout orthotropic cylinder 501.

In some embodiments, the thickness of each thermally conductive sheet 507 is substantially the same throughout orthotropic cylinder 501. In some embodiments, all thermally conductive sheets 507 have a first thickness, and all thermally insulating sheets 508 have second thicknesses that is substantially different from the first thickness. As an example, thermally conductive sheets 507 has a thickness that is larger than the thickness of thermally insulating sheets 508. In some embodiments, the first thickness and second thickness are both periodic. In some embodiments, the first thickness and the second thickness may vary across orthotropic cylinder 501.

In some embodiments, thermally conductive sheets 507 comprise metals such as, but not limited to, any of copper, gold, silver, aluminum, steel, titanium, molybdenum, tungsten, cobalt or nickel. In some examples, thermally conductive sheets 507 are metal foils. In some embodiments, thermally conductive materials include dielectric materials having high thermal conductivity such as, but not limited to, any of aluminum nitride, boron nitride, graphitic carbon-polymer or ceramic composites (e.g., carbon fiber composites), graphene-polymer or ceramic composites, diamond-polymer or ceramic composites or metal power-polymer or ceramic composites. Thermally conductive sheets 507 may have thicknesses ranging between 10 to 1000 microns.

In some embodiments, thermally insulating sheets 508 comprise dielectrics having high thermal resistance such as, but not limited to, any of epoxy resins, polyphenolic resins such as Bakelite, silica-based glasses, glass-polymer composites such as fiberglass, refractory ceramics such as clays, alumina, titania (titanium oxides), magnesium oxide, calcium oxide, gypsum or (calcium sulfate).

During operation of the device, lower contact plate 503 may be in contact with a source of heat, such as an oven or active heater. Upper contact plate 504 may be in contact with a heat sink, such as a cold plate or fluid-cooled heat sink. A heat flow pattern may be set up where heat flows predominantly from lower contact plate 504 to upper contact plate 503. As shown, orthotropic cylinder 501 is in the heat flow path, indicated by the upward-pointing arrows in the figure. Orthotropic cylinder 501 may present a path of high or low thermal resistance to the predominant component of heat flow in the z-dimension, depending on its orientation.

VTRI 500 may be in a fully thermally conductive state when thermally conductive sheets 507 and thermally insulating sheets 508 are parallel to the direction of heat flow, as shown in FIG. 5A. In the orientation shown in the figure, heat flows predominately along thermally conductive sheets 507 from lower contact plate 503 to upper contact plate 504. The thermal conductances in the plane of thermally conductive sheets 507 add in series (thermal resistances add in parallel). The total thermal conductivity may be the sum of the thermal conductances of each of the individual thermally conductive sheets 507. As the thermally insulating sheets 508 may have a thermal conductance that is significantly smaller than the thermal conductance of thermally conductive sheets 507, they may be neglected in the calculation of thermal conductance (or thermal resistance). In FIG. 5A, orthotropic cylinder 501 is oriented to place VTRI 500 in a conductive state with respect to the direction of heat flow.

Orthotropic cylinder 501 may be rotated to angles between zero and 90°, with respect to the z-axis of the figure. By rotation of orthotropic cylinder 501 to oblique angles, the effective thermal resistance VRTI 500 may be variable. At oblique angles of rotation between zero and 90°, the heat flow path is increasingly constricted as the insulating sheets 508 project on increasingly longer arcs of the lower perimeter of orthotropic cylinder 501, progressively obscuring the heat sink from the heat source.

Figure 5B:
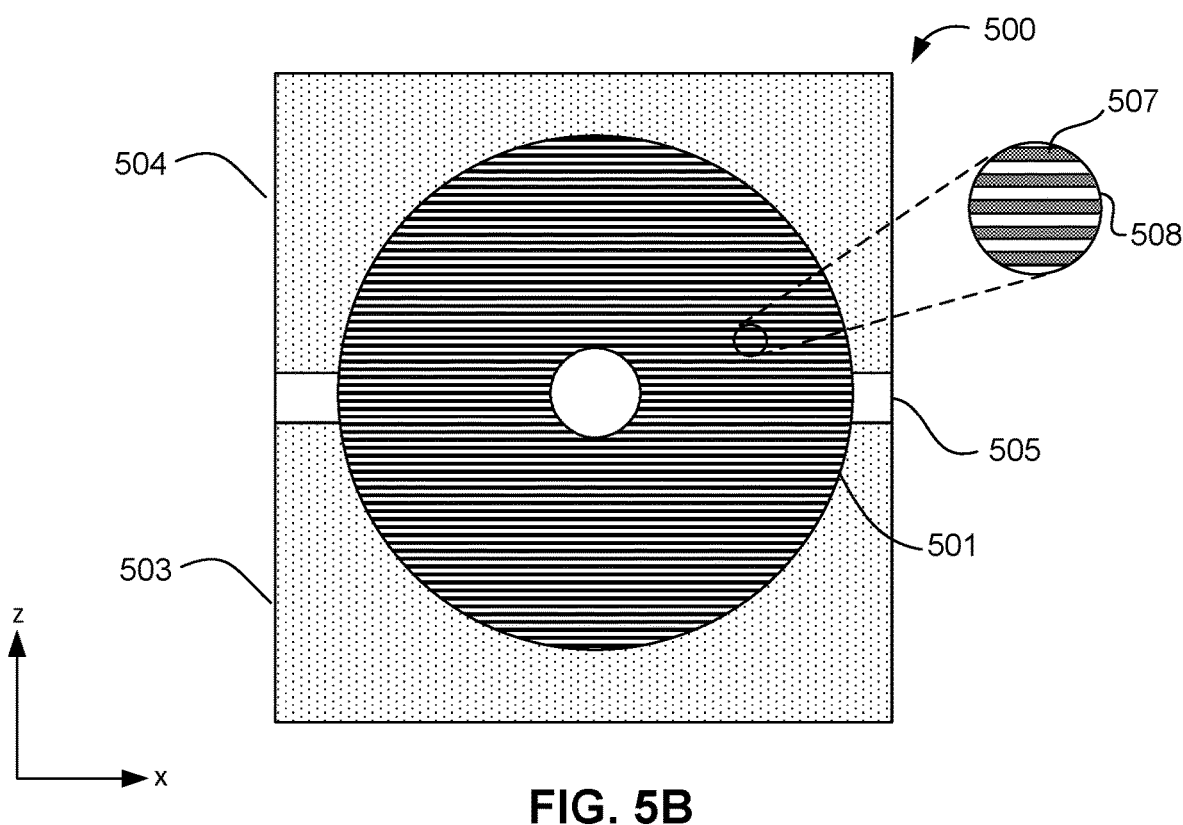
FIG. 5B illustrates a cross-sectional view of a VRTI comprising an orthotropic cylinder oriented orthogonally to the direction of heat flow, according to some embodiments of the disclosure.

FIG. 5B illustrates a cross-sectional view of VRTI 500 comprising orthotropic cylinder 501 oriented orthogonally to the direction of heat flow, according to some embodiments of the disclosure.

As shown in FIG. 5B, orthotropic cylinder 501 is rotated by 90° with respect to the orientation shown in FIG. 5A. In the illustrated geometry, thermally conductive sheets 507 and thermally insulating sheets 508 are orthogonal (horizontal in the figure) to the direction of heat flow between lower contact plate 503 and upper contact plate 504. The overall thermal resistance of the ensemble of thermally insulating sheets 508 may be added in series such that the thermal resistance of orthotropic cylinder 501 may be sum of the thermal resistances of each of the individual thermally insulating sheets 508. In this calculation, the thermal resistances of thermally conductive sheets 507 may be neglected.

Due to the orthogonal orientation of thermally insulating sheets 508 with respect to the predominate direction of heat flow (e.g., as indicated by the upward-pointing vertical arrows in FIG. 5A), orthotropic cylinder 501 may significantly reduce heat flow into upper contact plate 504 from lower contact plate 503, placing VRTI 500 in an insulating state. Gasket 505 and reflective interfaces 506 may block heat from flowing around orthotropic cylinder 501. The overall thermal resistance of orthotropic cylinder 501 may be increased by increasing the thickness of thermally insulating sheets 508 and/or the thickness of thermally conductive sheets 507. Materials employed in the composition of thermally insulating sheets 508 may be tailored to produce a desired thermal resistivity (e.g., the reciprocal of the thermal conductivity k). Combined with engineering the thickness of thermally insulating sheets 508, a desired overall thermal resistance of orthotropic cylinder 501 may be obtained.

Figure 6A:
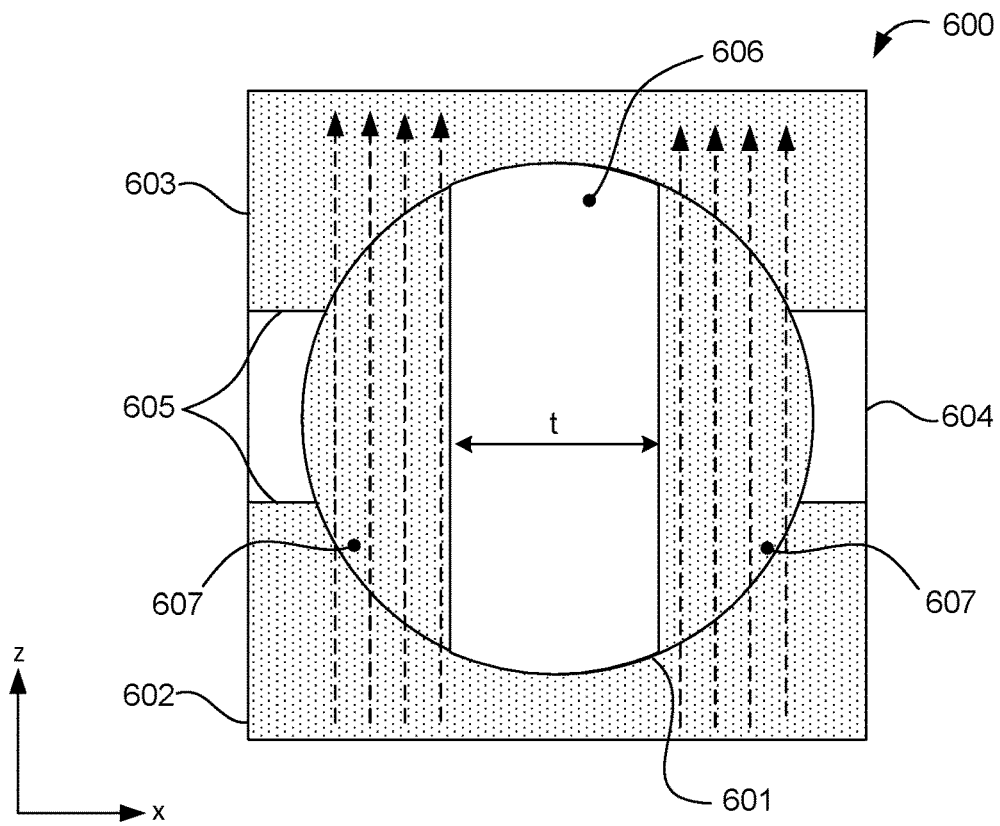
FIG. 6A illustrates a cross-sectional view in the x-z plane of a VRTI comprising an orthotropic cylinder oriented parallel to the direction of heat flow, according to some embodiments of the disclosure.

FIG. 6A illustrates a cross-sectional view in the x-z plane of VRTI 600 comprising orthotropic cylinder 601 oriented parallel to the direction of heat flow, according to some embodiments of the disclosure.

VRTI 600 comprises orthotropic cylinder 601 sandwiched between lower contact plate 602 and upper contact plate 603. Lateral to orthotropic cylinder 601 is gasket 604, also sandwiched between lower contact plate 602 and upper contact plate 603. Optically reflective interfaces 605 may optionally be included to interface between gasket 604 and lower and upper contact plates 602 and 603, respectively. Materials comprised by gasket 604 and optically reflective interfaces 605 may be the same or similar to the materials listed above for gasket 505 and optically reflective interfaces 506.

Orthotropic cylinder 601 comprises a single thermally insulating section 606 sandwiched between two thermally conducting sections 607. The thickness t (extending in the x-direction of the figure) of thermally insulating section 606 may be a substantial fraction of the diameter of orthotropic cylinder 601. In some embodiments, thermally insulating section 606 may have a thickness t of at least 10% of the diameter of orthotropic cylinder 601. Thickness t may be a function of the thermal resistivity (reciprocal of the thermal conductivity k) of the material comprised by thermally insulating section 606. The overall thermal resistance in the direction of thickness t is the product of the thermal resistivity and the thickness t. Depending on the material employed, the thickness t may be determined to obtain a desired thermal resistance of thermally insulating section 606.

Thermally conducting sections 607 extend from the edges of thermally insulating section 606 to the periphery of orthotropic cylinder 601. In some embodiments, thermally conducting sections 607 comprise a thermally conductive material including the materials listed above for thermally conducting sections 507 in FIG. 5A. As an example, thermally conducting sections 607 comprise copper.

In the orientation of orthotropic cylinder 601 shown in FIG. 6A, thermally conducting sections 607 bypass gasket 604, and thermally couple lower contact plate 602 to upper contact plate 603. In some embodiments, lower and upper contact plates 602 and 603, respectively, comprise the same material of thermally conductive sections 607. The dashed arrows indicate the direction of heat flow from lower contact plate 602, upward through orthotropic cylinder 601, to upper contact plate 603. Thermally conductive sections 607 are parallel to the direction of heat flow indicated by the dashed arrows, placing VRTI 600 in a conducting state.

In the orientation shown in FIG. 6A, thermally insulating section 606 partially blocks heat flow through the center region of orthotropic cylinder 601. The total volume of orthotropic cylinder 601 occupied by thermally insulating material contained within thermally insulating section 606 may be similar or approximately equal to the total volume of thermally insulating material in orthotropic cylinder 501 in FIGS. 5A-B. Likewise, the total volume of thermally conductive material in orthotropic cylinders 501 and 601 may be substantially the same. For substantially equal volumes of thermally conductive materials, the total heat transfer in terms of watts through orthotropic cylinder 601 may be similar or approximately equal to the heat transfer rate through orthotropic cylinder 501 for the same temperature differential.

Orthotropic cylinder 601 may be rotated to angles between zero and 90°, with respect to the z-axis of the figure. At oblique angles of rotation between zero and 90°, the heat flow path is increasingly constricted as the edges of thermally insulating section 606 project on increasingly longer arcs of the lower perimeter of orthotropic cylinder 601, progressively obscuring the heat sink from the heat source.

Figure 6B:
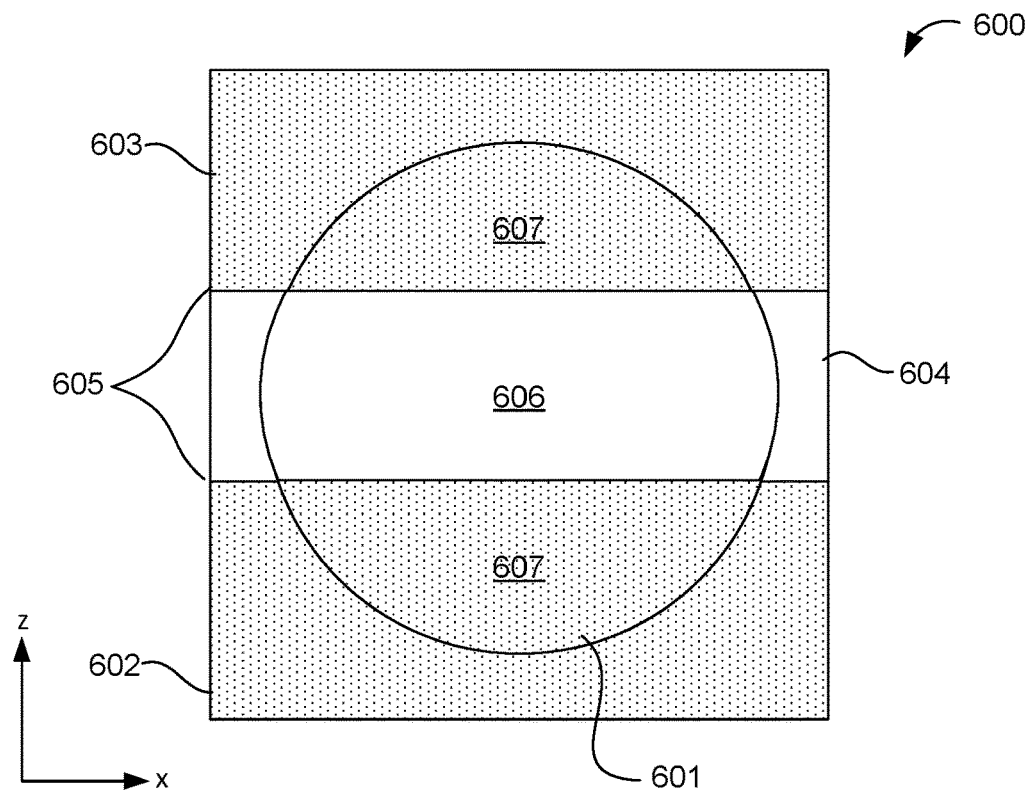
FIG. 6B illustrates a cross-sectional view in the x-z plane of a VRTI comprising an orthotropic cylinder oriented orthogonally to the direction of heat flow, according to some embodiments of the disclosure.

FIG. 6B illustrates a cross-sectional view in the x-z plane of VRTI 600 comprising orthotropic cylinder 601 oriented orthogonally to the direction of heat flow, according to some embodiments of the disclosure.

Orthotropic cylinder 601 is rotated 90° relative to the orientation shown in FIG. 6A. In this orientation, thermally insulating section 606 is aligned with insulating gasket 604, and the heat flow path between lower contact plate 602 and upper contact plate 603 is completely obscured by thermally insulating section 606. In the orientation shown in the figure, VRTI 600 is in an insulating state. Heat flow between lower and upper contact plates 602 and 603, respectively, may be additionally impeded by insulating gasket 604 aided by optically reflective interfaces 605.

In the orientation shown in FIG. 6B, thermally insulating section 606 impedes heat flow through the center region of orthotropic cylinder 601 by presenting a relatively large region of high thermal resistance in the heat flow path. The total volume of orthotropic cylinder 601 occupied by thermally insulating material contained within thermally insulating section 606 may be similar or approximately equal to the total volume of thermally insulating material in orthotropic cylinder 501 in FIGS. 5A-B. For substantially equal volumes of thermally insulating materials, the thermal resistance of orthotropic cylinder 601 when oriented as shown in FIG. 6B (to align thermally insulating section 604 orthogonal to the heat flow path denoted by the upward-pointing arrows in FIG. 6A) may be similar or approximately equal to the thermal resistance of orthotropic cylinder 501 if the insulating material is the same.

The distribution of thermally conducting material and thermally insulating material may have a large influence on the performance of VRTI 600 as a thermal switch. Lumping the thermally conducting and thermally insulating materials into sections of orthotropic cylinder 601 as opposed to the interleaved sheets (e.g. thermally conducting sheets 507 and thermally insulating sheets 508 in FIGS. 5A-B) of orthotropic cylinder 501 in FIGS. 5A-B.

As an example, VRTI 600 may comprise a 7.5 mm diameter orthotropic cylinder having a thermally insulating section comprising an epoxy resin, with a thickness of 2.5 mm. The thermally conductive sections (e.g. thermally conductive sections 607) may comprise copper. VRTI 600 in an insulating state (e.g., orthotropic cylinder 601 having an orthogonal orientation to heat flow as depicted in FIG. 6B) may have an overall thermal resistance of 26° C.-cm$^2$/W. The overall thermal resistance of VRTI 600 switching factor (e.g., the ratio of thermal resistances when orthotropic cylinder 601 is rotated 90° from a fully conducting state to a fully insulating state) may be a factor of over 90 when VRTI 600 is switched between conducting state (e.g., the orientation shown in FIG. 6A) and the insulating state (e.g., the orientation shown in FIG. 6B).

By way of comparison, VRTI 500 comprises orthotropic cylinder 501 having an interleaved array of thin (e.g., approximate thicknesses of 50 microns) thermally conductive sheets (e.g., thermally conductive sheets 507, FIG. 5A) and thermally insulating sheets (e.g. thermally insulating sheets 508, FIG. 5A), may have an overall thermal resistance of approximately 7 to 8° C.-cm$^2$/W when in the fully insulating state for the same thermally conductive and thermally insulating materials employed in thermally conductive sheets 507 and thermally insulating sheets 508. VRTI 500 may exhibit a switching factor of approximately 20.

Figure 7A:
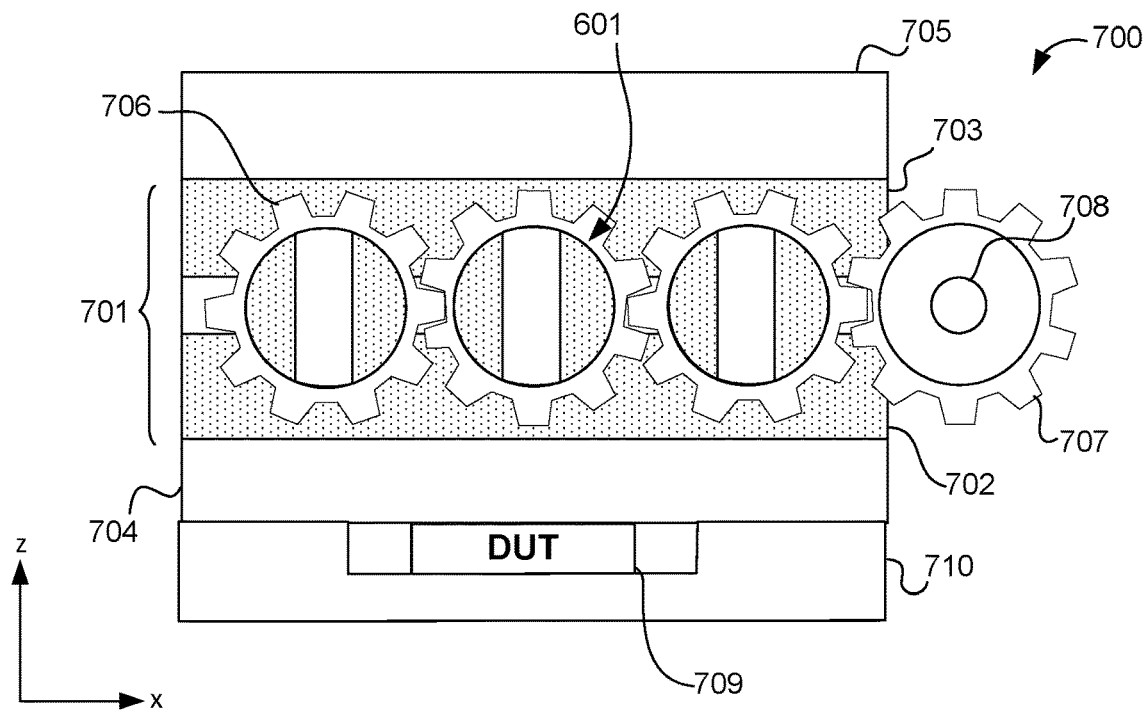
FIG. 7A illustrates a profile view in the x-z plane of a DUT test head comprising a VRTI, according to some embodiments of the disclosure.

FIG. 7A illustrates a profile view in the x-z plane of DUT test head 700 comprising VRTI 701. Multiple orthotropic cylinders 601 within VRTI 701 are ganged together for synchronous rotation, according to some embodiments of the disclosure.

VRTI 701 is shown to be part of DUT test head 700. VRTI 701 may span a width (in the x-dimension of the figure) that is several times the diameter of orthotropic cylinders 601. VRTI 701 may require a low profile (e.g., a minimal z-height from bottom of lower contact plate 702 to the top of upper contact plate 703), as shown, to minimize the length of the heat flow path between heater 704 and heat sink 705.

In the illustrated embodiment, VRTI 701 comprises multiple cylinders 601 that are ganged together by gears 706 for synchronous actuation. Drive gear 707 may be external to VRI 701, as shown, to drive the gear train comprising meshed gears 706 mounted on orthotropic cylinders 601. In FIG. 7A, VRTI 701 is viewed face-on. Orthotropic cylinders 601 protrude above the plane of the figure from the face of VRTI 701 (shown in the plan view of FIG. 7B). Gears 706 are attached on the protruding ends of orthotropic cylinders 601, and mesh with drive gear 707 that is coupled to shaft 708.

Shaft 708 may be coupled to a single rotary actuator, such as a stepper motor, a dc motor, a hydraulic motor or a pneumatic motor. In some embodiments, a traction belt driven by drive gear 707 may be employed to drive gears 706, whereby gears 706 may not require meshing with each other. In some embodiments, a separate actuator may be employed to drive each orthotropic cylinder 601 individually.

Orthotropic cylinders 601 are substantially the same as orthotropic cylinder 601 described above and shown in FIGS. 6A and 6B. In the illustrated embodiment, orthotropic cylinders 601 are oriented to maximize heat flow between heater 704 and heat sink 705. VRTI 701 is in a conducting state. During operation of DUT test head 700, power to heater 704 may be ramped down to a shut-off state, allowing heater 704 to begin to cool. VRTI 701 opens a conductive heat flow path between heater 704 and heat sink 705. In some embodiments, heat sink 705 includes circulating liquid nitrogen to establish a very large temperature gradient through VRTI 701. The large temperature gradient enables rapid cooling of heater 704, and by consequence, rapid cooling of DUT 709 and surrounding oven 710.

Conversely, power to heater 704 may be ramped up to heat DUT 709. Orthotropic cylinders 601 may be rotated 90° to thermally isolate heater 704 from heat sink 705. In the orthogonal orientation (not shown), VRTI 701 is in an insulating state. Heat flow between heater 704 and heat sink 705 may also be throttled by rotation of orthotropic cylinders to oblique angles between zero and 90°, enabling intermediate rates of heat flow.

Figure 7B:
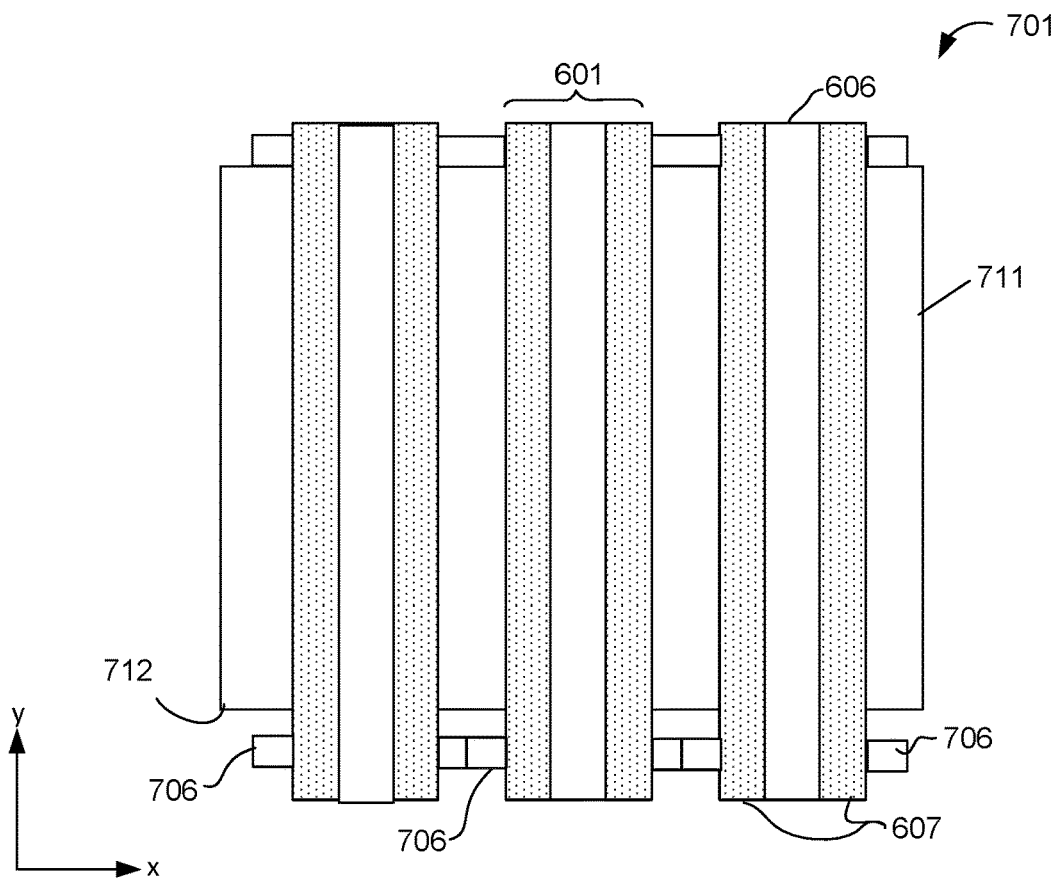
FIG. 7B illustrates a cross-sectional view in the x-y plane of the VRTI of FIG. 7A, according to some embodiments of the disclosure.

FIG. 7B illustrates a cross-sectional view in the x-y plane of VRTI 701, according to some embodiments of the disclosure.

The cross-sectional plan view shown in FIG. 7B is taken through a plane section extending through the center of VRTI 701 in FIG. 7A. Orthotropic cylinders 601 extend in the y-dimension through insulating gasket 711 (and through lower and upper contact plates 702 and 703, not shown).

Orthotropic cylinders 601 extend out of the main body of VRTI 701 from front face 712 to enable attachment of gears 706. A thermal grease or gel may be employed as a lubricant at the interfaces between orthotropic cylinders 601 and insulating gasket 711 (also with lower and upper contact plates 702 and 703, respectively, FIG. 7A).

Figure 8A:
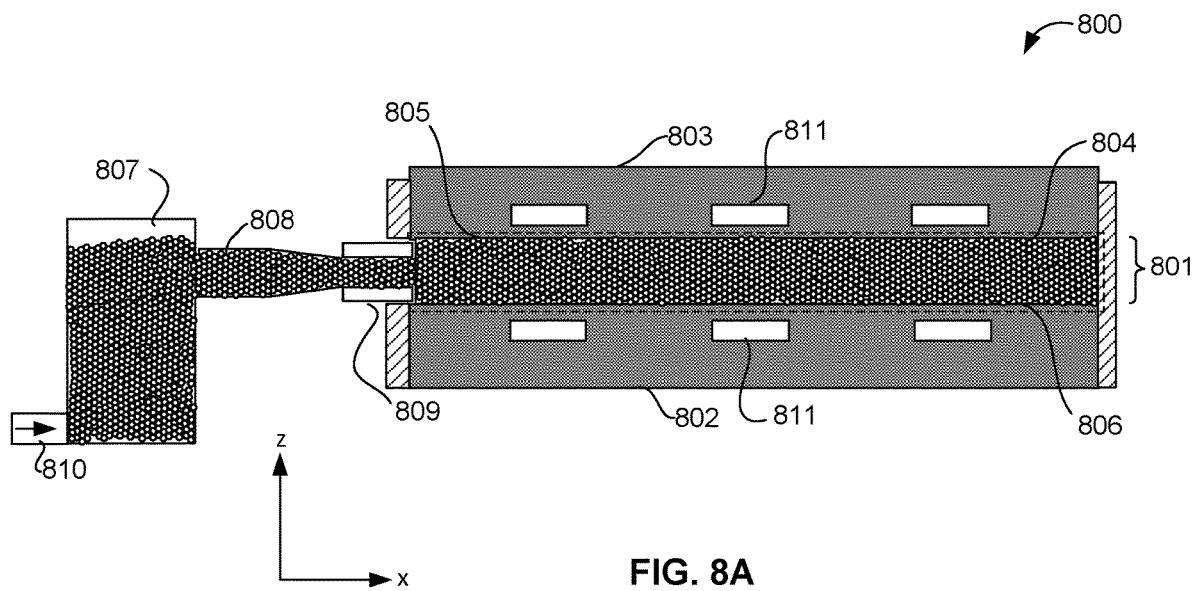
FIG. 8A illustrates a cross-sectional view in the x-z plane of a VRTI in a conducting state, comprising mobile high-k particles within a chamber, according to some embodiments of the disclosure.

FIG. 8A illustrates a cross-sectional view in the x-z plane of VRTI 800, comprising mobile high-k particles within chamber 801, according to some embodiments of the disclosure.

VRTI 800 comprises chamber 801 between lower contact plate 802 and upper contact plate 803. In some embodiments, chamber 801 is a space between lower and upper contact plates 802 and 803, respectively. In the illustrated embodiment, chamber 801 is substantially filled with mobile high-k particles 804, shown within the dashed outline. When chamber 801 is substantially filled by mobile high-k particles 804, lower contact plate 802 and upper contact plate 803 are thermally coupled by multiple chains of mobile high-k particles spanning the space between inner surfaces 805 and 806 of lower contact plate 802 and upper contact plate 803. By substantially filled, it is understood that a sufficient fraction of the volume of chamber 801 is occupied by mobile high-k particles 804 to create a minimal thermal coupling between lower and upper contact plates 802 and 803, respectively. In some embodiments, chamber 801 is substantially filled when at least 70% of its volume is occupied by mobile high-k particles 804. When chamber 801 is substantially filled, VRTI 800 is in a conducting state.

In some embodiments, mobile high-k particles 804 are injectable into chamber 801 and removable therefrom. Containment vessel 807 is coupled to chamber 801 through conduit 808 and port 809, enabling injection and withdrawal of mobile high-k particles 804 into and from chamber 801, respectively. In some embodiments, mobile high-k particles 804 comprise materials having high thermal conductivity, such as, but not limited to, iron, copper, aluminum, molybdenum, cobalt, aluminum nitride, boron nitride or, iron oxides (e.g., ferrites).

In some embodiments, mobile high-k particles 804 are contained or suspended within a liquid. As an example, mobile high-k particles 804 are ferrofluids comprising paramagnetic nanoparticles (e.g., iron, iron oxide or ferrite particles) suspended in a liquid such as water, aqueous mixtures of alcohols, glycols, etc., non-aqueous solutions of solvents and oils. In some embodiments, mobile high-k particles 804 range in diameter from sub-micron (e.g., nanoparticles) to several millimeters. In some embodiments, high-k particles 804 comprise powders having diameters ranging between 1 micron and 1000 microns. In some embodiments, mobile high-k particles 804 comprise granules or ball bearings having diameters ranging between 1 mm to 10 mm. Individual particles may have thermal conductivities of at least 10 W/mK. Ensembles of nanoparticles may exhibit thermal conductivities of several hundred to several thousand W/mK. As an example ferrite ferrofluids may exhibit effective thermal conductivities over 10 kW/mK.

In some embodiments, mobile high-k particles 804 are injected into and withdrawn out of chamber 801 through coupling 810. In some embodiments, coupling 810 is coupled to a hydraulic or pneumatic pump. In some embodiments, coupling 810 is coupled to a compressed gas cylinder. Compressed gas may be employed to blow small dust-size particles into chamber 801. Alternatively, compressed gas may be employed to move larger particles, such as granules, pellets or small ball bearings having diameters over 1 mm into and/or out of chamber 801.

In some embodiments, electromagnets 811 are within lower and upper contact plates 802 and 803, and may aid moving direct mobile high-k particles 804 comprising ferromagnetic or ferrimagnetic particles. In some embodiments, mobile high-k particles 804 are ferromagnetic or ferromagnetic nanoparticles contained in ferrofluids. As an example, electromagnets 811 may be activated to attract a ferrofluid (e.g., as a source of mobile high-k particles 804) vertically (in the z-direction) toward inner surface 805, making contact therewith. Contact with inner surface 805 by the ferrofluid provides a path of lower thermal resistance for heat transfer between lower contact plate 802 and upper contact plate 803, placing VRTI 800 in a conducting state.

In some embodiments, mobile high-k particles 804 are moved by pneumatic suction and compression. As an example, compressed air may blow mobile high-k particles 804 that are small particulates (e.g., diameters ranging between 1 and 100 microns) from containment vessel 807 into chamber 801. Withdrawal of mobile high-k particles from chamber 801 may be by vacuum applied to containment vessel 807. In alternative embodiments, chamber 801 may be sealed to permanently contain mobile high-k particles 804 comprising a ferrofluid or other magnetic particles. Electromagnets 811 may activate to expand and deactivate to contract the ferrofluid or other magnetic particles vertically (in the z-direction) to make and break contact, respectively, with inner surface 805 of upper contact plate 803.

Figure 8B:
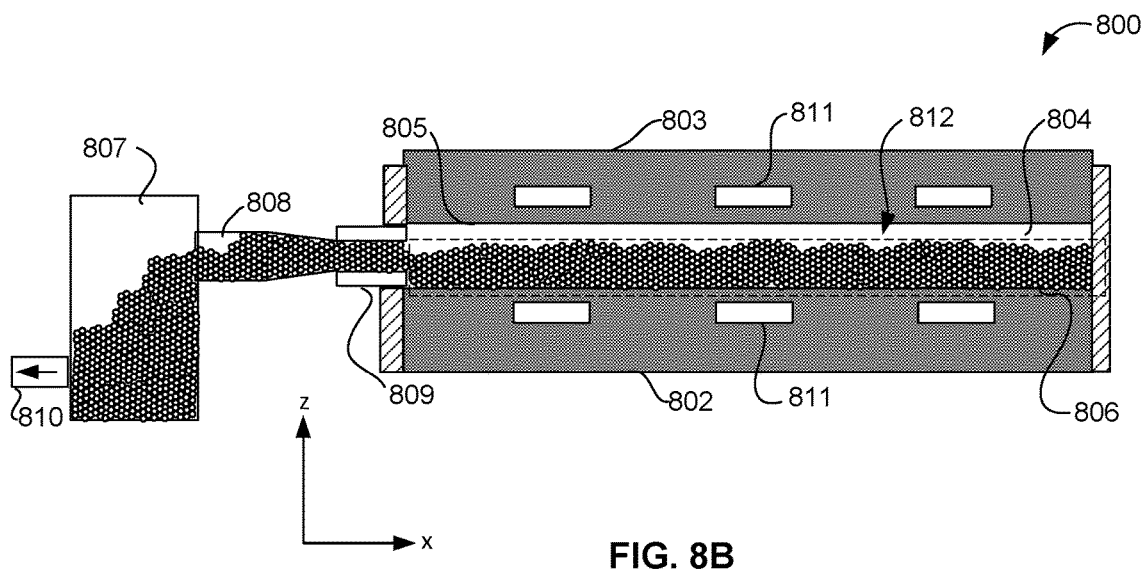
FIG. 8B illustrates a cross-sectional view in the x-z plane of the VRTI shown in FIG. 8A in an insulating state, comprising mobile high-k particles within a chamber, according to some embodiments of the disclosure.

FIG. 8B illustrates a cross-sectional view in the x-z plane of VRTI 800, comprising mobile high-k particles within chamber 801. VRTI 800 is in an insulating state, according to some embodiments of the disclosure.

FIG. 8B shows a reduced volume of mobile high-k particles 804 (within dashed outline) within chamber 801, whereby the low thermal resistance coupling between lower contact plate 302 and upper contact plate 803 is broken. Air or other gas occupies void space 812 over remaining mobile high-k particles 804, which may partially occupy chamber 801 or are completely evacuated therefrom. VRTI 800 is in an insulating state as air or other gas may have a significantly lower thermal conductivity than mobile high-k particles 804.

In the illustrated embodiment, mobile high-k particles 804 are withdrawn from chamber 801 through conduit 808 and port 809, into containment vessel 807. Particles 804 may exit containment vessel 807 through port 810 by suction. In alternative embodiments, mobile high-k particles 804 are blown out of chamber 801 by introduction of compressed gas from a port or ports on the opposite side or floor of chamber 801 (not shown).

In alternative embodiments, electromagnets 811 may be deactivated to contract a permanent mass of mobile high-k particles 804 comprising a ferrofluid or other magnetic particles within chamber 801. Deactivation of electromagnets 811 may break contact with inner surface 805 of upper contact plate 803, placing VRTI in an insulating state.

Figure 9:
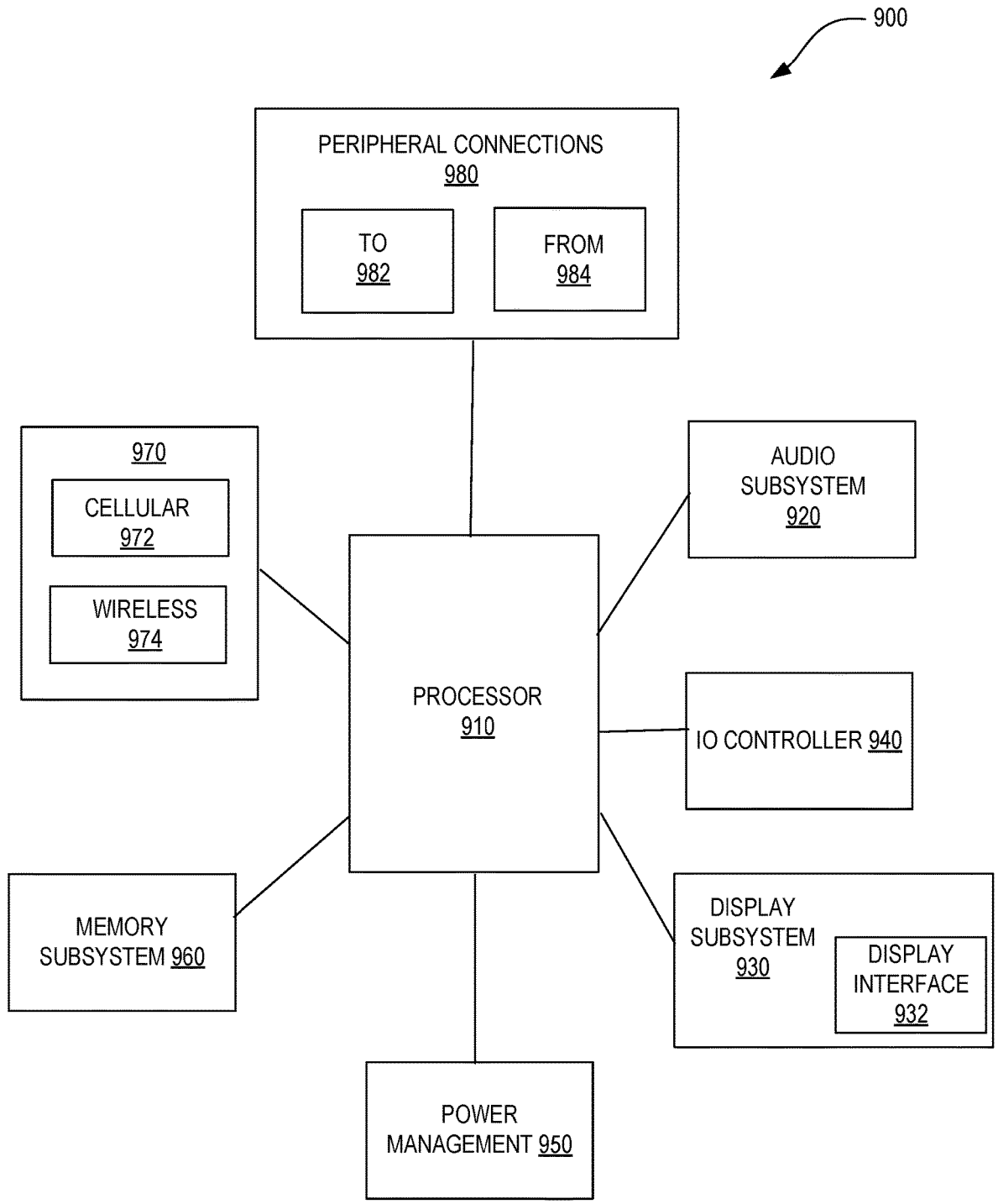
FIG. 9 illustrates a block diagram of a computing device as part of a system-on-chip (SoC) package in an implementation of a computing device, according to some embodiments of the disclosure.

FIG. 9 illustrates a block diagram of computing device 900 as part of a system-on-chip (SoC) package in an implementation of a computing device, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit (CPU) or a graphical processing unit (GPU)), comprising one or more dies, having been subject as a DUT (e.g., DUT 104 in FIG. 1) in test head system 100 (FIG. 1) is mounted on a motherboard of computing device 900.

In some embodiments, computing device has wireless connectivity (e.g., Bluetooth and/or WiFi). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant.

According to some embodiments, processor 910 represents a CPU or a GPU, and can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus for testing integrated circuits (ICs) comprising a first thermal contact plate having a first surface to interface with a heat source, the first surface is opposite a second surface, a second thermal contact plate above the first thermal contact plate and separated therefrom, the second thermal contact plate having a third surface to interface with a heat sink, the third surface is opposite a fourth surface, the fourth surface is opposite the second surface; and a variable-resistance thermal interface (VRTI) structure between the first and second thermal contact plates, the VRTI structure having a maximal thermal conductivity associated with a first state thereof and a minimal thermal conductivity associated with a second state thereof.

Example 2 includes all of the features of example 1, wherein the first state comprises a first plurality of thermally conductive particles within a chamber between the first and second thermal contact plates, wherein the second state comprises a second plurality of thermally conductive particles within the gap, and wherein the first plurality of thermally conductive particles is greater than the second plurality of thermally conductive particles.

Example 3 includes all of the features of example 2, wherein the thermally conductive particles comprise any of iron, copper, aluminum, molybdenum, boron, nitrogen, or oxygen.

Example 4 includes all of the features of examples 2 or 3, wherein the thermally conductive particles are magnetic.

Example 5 includes all of the features of example 4, wherein the thermally conductive particles are a ferrofluid.

Example 6 includes all of the features of example 1, wherein the VRTI comprises a deformable thermal interface material (DTIM) within between the second surface and the fourth surface, wherein the first state comprises the DTIM having a first thickness that is equal to a distance between the second surface and the fourth surface and thermally couples the first contact structure to the second contact structure, wherein the second state comprises the DTIM having a second thickness that is less than the distance between the second surface and the fourth surface, and wherein the first contact structure is thermally decoupled from the second contact structure.

Example 7 includes all the features of example 6, wherein the DTIM comprises any one of gallium, indium, tin aluminum, boron, nitrogen, oxygen, silver, copper or zinc.

Example 8 includes all of the features of example 1, wherein a gap is between the first thermal contact structure and the second thermal contact structure, wherein the first thermal contact structure comprises a first plurality of fins that extend into the gap, and the second thermal contact structure comprises a second plurality of fins that extend into the gap, wherein the first plurality of fins is over and aligned with the second plurality of fins, a shaft extends within the gap, the shaft having a third plurality of fins extending orthogonally from the shaft between ones of the first plurality of fins and the ones of the second plurality of fins.

Example 9 includes all of the features of example 8, wherein the shaft is translatable along the length of the gap, wherein the first state comprises a first shaft position wherein the third plurality of fins is in simultaneous contact with the first plurality of fins and the second plurality of fins, and wherein the second state comprises a second shaft position wherein the third plurality of fins is separated from the first and second pluralities of fins.

Example 10 includes all of the features of example 8, wherein the shaft is rotatable, wherein the first state comprises a first shaft position wherein the third plurality of fins is in simultaneous contact with the first and second pluralities of fins, and wherein the second state comprises a second shaft position wherein the third plurality of fins is separated from the first plurality of fins or the second plurality of fins.

Example 11 includes all of the features of example 1, wherein the VRTI comprises at least one orthotropic cylinder extending between the second surface and the fourth surface, wherein the at least one orthotropic cylinder comprises a first plurality of laminate sheets comprising a first material interleaved with a second plurality of laminate sheets comprising a second material, wherein the first material has a high thermal conductivity, and the second material has a low thermal conductivity.

Example 12 includes all of the features of example 11, wherein the first state comprises the first and second pluralities of laminate sheets oriented orthogonally to the second surface and the fourth surface, and wherein the second state comprises the first and second pluralities of laminate sheets oriented parallel to the second surface and the fourth surface.

Example 13 includes all of the features of example 11, wherein the at least one orthotropic cylinder comprises a first layer and a second layer, wherein the first layer and the second layer extend longitudinally along the central axis of the shaft, wherein the first layer and the second layer comprise the first material, wherein a third layer extends longitudinally along the central axis of the orthotropic cylinder between the first layer and the second layer, and wherein the third layer comprises the second material.

Example 14 includes all of the features of example 13, wherein the third layer has a thickness that is at least 10% of the diameter of the shaft.

Example 15 includes all of the features of any one of examples 11 to 14, wherein the first material comprises copper, gold, silver, aluminum, cobalt, carbon or silicon.

Example 16 includes all of the features of any one of examples 11 to 15, wherein the second material comprises a phenol-formaldehyde resin or an epoxy resin.

Example 17 includes all of the features of any one of examples 11 to 16, wherein the at least one orthotropic cylinder has a transverse thermal resistance of at least 10° C.-cm$^2$/W when the orthotropic cylinder is oriented such that the first and second pluralities of laminate sheets are orthogonal to the direction of heat flow.

Example 18 includes all of the features of any one of examples 11 to 17, wherein the at least one orthotropic cylinder has a switch ratio of at least 20 to 1, wherein the switch ratio is the ratio of transverse thermal resistance of the orthotropic cylinder when the first and second pluralities of laminate sheets are orthogonal to the direction of transverse heat flow to the transverse thermal resistance of the orthotropic cylinder when the first and second pluralities of laminate sheets are parallel to the direction of the transverse heat flow.

Example 19 includes all of the features of any one of examples 11 to 18, wherein the at least one orthotropic cylinder has a transverse thermal resistance of at least 25° C.-cm$^2$/W when the orthotropic cylinder is oriented such that the third layer is parallel to the first and the second thermal interfaces and orthogonal to the direction of heat flow.

Example 20 includes all of the features of any one of examples 11 to 19, wherein the at least one orthotropic cylinder has a switch ratio of at least 60 to 1, wherein the switch ratio is the ratio of transverse thermal resistance of the orthotropic cylinder when the third layer is orthogonal to the direction of transverse heat flow to the transverse thermal resistance of the orthotropic cylinder when the third layer is parallel to the direction of the transverse heat flow.

Example 21 includes all of the features of example 1, wherein the VRTI comprises a heat pipe, wherein the heat pipe comprises a first branch interfacing with the second surface and a second branch interfacing with the fourth surface, and wherein the heat pipe comprises a compression chamber to regulate the vapor pressure of a working fluid within the heat pipe.

Example 22 includes all of the features of example 21, wherein the first state comprises a first working fluid boiling point below the temperature of the first surface, and wherein the second state comprises a second working fluid boiling point above the temperature of the first surface.

Example 23 includes all of the features of examples 21 or 22, wherein the compression chamber comprises a piston and a piston chamber.

Example 24 includes all of the features of any one of examples 21 to 23, wherein the working fluid is any one of water, methanol, ethanol, propanol, isopropanol, butanol, isobutanol, and the like; ammonia, volatile fluorocarbons such as fluoromethanes and chlorofluoromethanes, fluoroethanes or chlorofluoroethanes.

Example 25 is a system comprising a testing head comprising a first thermal contact plate having a first surface to interface with a hot mass, the first surface is opposite a second surface a second thermal contact plate above the first thermal contact plate and separated therefrom, the second thermal contact plate having a third surface to interface with a cold mass, the third surface is opposite a fourth surface, the fourth surface is opposite the second surface; and a variable-resistance thermal interface (VRTI) structure between the first and second thermal contact plates, the VRTI structure having a maximal thermal conductivity associated with a first state thereof and a minimal thermal conductivity associated with a second state thereof; a motion inducing device coupled to the VRTI, wherein the hot mass is between the first surface and a controlled temperature chamber, the controlled temperature chamber to hold a device under test (DUT); and the cold mass is adjacent to the third surface.

Example 26 includes all of the features of example 25, wherein the second surface comprises a plurality of orifices, and wherein the plurality of orifices is coupled to a pressurized gas source.

Example 27 includes all of the features of example 26, wherein a deformable thermal interface material (DTIM) is between the second surface and the fourth surface, and wherein the DTIM is compressed by pressurized gas supplied by the pressurized gas source and flowing through the plurality of orifices.

Example 28 includes all of the features of any one of examples 25 to 27, wherein the motion-inducing device comprises a shaft comprising a plurality of fins extending orthogonally from the shaft coupled to any of a pneumatic actuator, a hydraulic actuator or an electromechanical actuator.

Example 29 includes all of the features of any one of examples 25 to 28, wherein the motion-inducing device comprises one or more electromagnets adjacent to the second surface and the fourth surface, wherein the one or more electromagnets are to move magnetic thermally conductive particles in a chamber between the second and fourth surfaces, and wherein the one or more electromagnets are to cause the magnetic thermally conductive particles to thermally couple the second surface to the fourth surface.

Example 30 includes all of the features of any one of examples 25 to 29, wherein the motion inducing device comprises a pressurized gas source pneumatically coupled to a chamber between the second surface and the fourth surface, wherein the pressurized gas source is to be operated to blow a plurality of thermally conductive particles into the chamber, wherein the plurality of thermally conductive particles fill the chamber, and wherein a vacuum within the chamber is to remove the plurality of thermally conductive particles from the chamber.

Example 31 includes all of the features of any one of examples 25 to 30, wherein the motion inducing device comprises a pump is coupled to a chamber between the second surface and the fourth surface, wherein the pump is to move a plurality of thermally conductive particles suspended in a liquid into the chamber.

Example 32 includes all of the features of any one of examples 25 to 31, wherein the hot mass is a heater.

Example 33 includes all of the features of any one of examples 25 to 32, wherein the cold mass is a heat sink or a cold plate coupled to a liquid nitrogen reservoir.

Example 34 includes all of the features of any one of examples 25 to 33, wherein the DUT is an integrated circuit.

Example 35 includes all of the features of example 34, wherein the integrated circuit is a microprocessor, a memory or an analog circuit.

An abstract is submitted with the understanding that it will not be used to limit the scope or meaning of the claims. The following claims are hereby incorporated into the detailed description, with each claim standing on its own as a separate embodiment.

We claim:

1. An apparatus for testing integrated circuits (ICs), comprising:
    a first thermal contact structure having a first surface and an opposing second surface;
    a second thermal contact structure having a first surface and an opposing second surface; and
    a variable-resistance thermal interface (VRTI) structure comprising a chamber between the first and second thermal contact structures, wherein the second surfaces of the first and second thermal contact structures interface with the VRTI structure and one of the first surfaces of the first and second thermal contact structures is to interface with a device under test (DUT), the VRTI structure having a first thermal conductivity associated with a first state thereof and a second thermal conductivity associated with a second state thereof, wherein the first state comprises a first plurality of thermally conductive particles within the chamber, wherein the second state comprises a second plurality of thermally conductive particles within the chamber, and wherein the first plurality of thermally conductive particles is greater than the second plurality of thermally conductive particles.

2. The apparatus for testing ICs of claim 1, wherein the thermally conductive particles comprise any of iron, copper, aluminum, molybdenum, boron, nitrogen, or oxygen.

3. The apparatus for testing ICs of claim 1, wherein the thermally conductive particles are magnetic.

4. The apparatus for testing ICs of claim 3, further comprising:
    one or more electromagnets adjacent to the second surface of the first thermal contact structure or the second thermal contact structure.

5. The apparatus for testing ICs of claim 1, further comprising:
    a pressurized gas source pneumatically coupled to the chamber, wherein the pressurized gas source is operable to blow a portion of the first plurality of thermally conductive particles into the chamber.

6. The apparatus for testing ICs of claim 1, wherein the first plurality of thermally conductive particles have diameters in the range of 1 micron to 1000 microns.

7. An apparatus for testing integrated circuits (ICs), comprising:
    a cold mass having a first surface and an opposing second surface;
    a heater having a first surface and an opposing second surface;
    a chamber between the second surfaces of the cold mass and the heater, wherein one of the first surfaces of the cold mass and the heater is to interface with a device under test (DUT); and
    a motion inducing device coupled to the chamber, the motion inducing device operable to transfer thermally conductive particles into the chamber.

8. The apparatus for testing ICs of claim 7, wherein, in a first state, the chamber comprises a first plurality of thermally conductive particles and, in a second state, the chamber comprises a second plurality of thermally conductive particles greater than the first plurality of thermally conductive particles.

9. The apparatus for testing ICs of claim 7, wherein the motion inducing device comprises a pressurized gas source pneumatically coupled to the chamber.

10. The apparatus for testing ICs of claim 7, wherein the motion inducing device comprises one more electromagnets adjacent to the chamber.

11. The apparatus for testing ICs of claim 7, wherein the thermally conductive particles are within a liquid, the liquid comprising one of water, alcohol, glycol, or a non-aqueous solution.

12. The apparatus for testing ICs of claim 7, wherein the thermally conductive particles comprise ferromagnetic particles in a ferrofluid.

13. The apparatus for testing ICs of claim 7, wherein the thermally conductive particles comprise any of iron, copper, aluminum, molybdenum, boron, nitrogen, or oxygen.

14. The apparatus for testing ICs of claim 7, wherein the first plurality of thermally conductive particles have diameters in the range of 1 micron to 1000 microns.

15. An apparatus for testing integrated circuits (ICs), comprising:
    a first thermal contact structure having a first surface and an opposing second surface;
    a second thermal contact structure having a first surface and an opposing second surface; and a variable-resistance thermal interface (VRTI) structure comprising a chamber between the first and second thermal contact structures, wherein the second surfaces of the first and second thermal contact structures interface with the VRTI structure and one of the first surfaces of the first and second thermal contact structures is to interface with a device under test (DUT), the VRTI structure having a first state comprising a first plurality of thermally conductive particles within the chamber and a second state comprising a second plurality of thermally conductive particles within the chamber, wherein the first plurality of thermally conductive particles is greater than the second plurality of thermally conductive particles.

16. The apparatus for testing ICs of claim 15, wherein the thermally conductive particles comprise any of iron, copper, aluminum, molybdenum, boron, nitrogen, or oxygen.

17. The apparatus for testing ICs of claim 15, wherein the thermally conductive particles are magnetic.

18. The apparatus for testing ICs of claim 17, further comprising:
one or more electromagnets adjacent to the second surface of the first thermal contact structure or the second thermal contact structure.

19. The apparatus for testing ICs of claim 15, further comprising:
a pressurized gas source pneumatically coupled to the chamber, wherein the pressurized gas source is operable to blow a portion of the first plurality of thermally conductive particles into the chamber.

20. The apparatus for testing ICs of claim 15, wherein the first plurality of thermally conductive particles have diameters in the range of 1 micron to 1000 microns.

* * * * *